United States Patent
Lin et al.

(10) Patent No.: US 10,498,255 B2
(45) Date of Patent: Dec. 3, 2019

(54) MULTI-LEVEL INVERTER AND METHOD FOR PROVIDING MULTI-LEVEL OUTPUT VOLTAGE BY UTILIZING THE MULTI-LEVEL INVERTER

(71) Applicant: KONINKLIJKE PHILIPS N.V., Eindhoven (NL)

(72) Inventors: Yingfeng Lin, Eindhoven (NL); Martin Alexander Hollander, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 233 days.

(21) Appl. No.: 15/513,589

(22) PCT Filed: Sep. 29, 2015

(86) PCT No.: PCT/EP2015/072478
§ 371 (c)(1),
(2) Date: Mar. 23, 2017

(87) PCT Pub. No.: WO2016/050800
PCT Pub. Date: Apr. 7, 2016

(65) Prior Publication Data
US 2018/0231623 A1  Aug. 16, 2018

(30) Foreign Application Priority Data

Sep. 29, 2014 (WO) ................. PCT/CN2014/087796
Dec. 11, 2014 (EP) ..................................... 14197383

(51) Int. Cl.
*H02M 7/483* (2007.01)
*H02M 1/12* (2006.01)
(Continued)

(52) U.S. Cl.
CPC ........ *H02M 7/483* (2013.01); *G01R 33/3852* (2013.01); *H02M 1/12* (2013.01); *H02M 7/493* (2013.01); *H02M 2007/4835* (2013.01)

(58) Field of Classification Search
CPC .. G01R 33/3852; H02M 7/483; H02M 7/493; H02M 1/12; H02M 2007/4835; H03K 7/08
See application file for complete search history.

(56) References Cited

U.S. PATENT DOCUMENTS 6,246,599 B1 * 6/2001 Jang ...................... H02M 3/337
363/132
6,356,462 B1 * 3/2002 Jang .................. H02M 3/33569
363/17

(Continued)

FOREIGN PATENT DOCUMENTS

JP  2000092863 A  3/2000
WO  2015027693 A1  3/2015

OTHER PUBLICATIONS

Juan Sabaté, Luis J. Garcés, Paul M. Szczesny and Wesley Skeffington, "Dead-time Compensation for a High-Fidelity Voltage" Fed Inverter Power Electronics Specialists Conference, 2008. PESC 2008.

(Continued)

*Primary Examiner* — Kyle J Moody

(57) ABSTRACT

A multi-level inverter provides multi-level output voltage. The multi-level inverter includes at least one cascaded H-bridge multi-level module. Each H-bridge multi-level module comprises a first H-bridge multi-level leg and a second H-bridge multi-level leg connected in parallel. Each of the first and second H-bridge multi-level legs includes a first inverter leg and a second inverter leg coupled in parallel through a coupled inductor. The first and second inverter legs are coupled respectively to a primary winding and a (Continued)

second winding of the coupled inductor for providing first and second input voltages with multiple voltage levels. The primary and secondary windings of the coupled inductor are coupled in series and a junction node of the primary and secondary windings forms an output terminal of the H-bridge multi-level leg. The first input voltage has a predetermined phase shift relative to the second input voltage. The multi-level inverter can have lower change in output voltage and thus eliminates problems caused by a large change in output voltage.

17 Claims, 20 Drawing Sheets

(51) Int. Cl.
*H02M 7/493* (2007.01)
*G01R 33/385* (2006.01)

(56) References Cited

U.S. PATENT DOCUMENTS

| | | | |
|---|---|---|---|
| 6,400,590 B2 | 6/2002 | Hickman | |
| 6,671,329 B1 | 12/2003 | Lenz | |
| 7,136,294 B2* | 11/2006 | Phadke | H02M 1/34 363/132 |
| 8,749,094 B2 | 6/2014 | Huisman | |
| 9,222,997 B2 | 12/2015 | Ham | |
| 9,389,288 B2* | 7/2016 | Sabate | G01R 33/3852 |
| 9,496,805 B2* | 11/2016 | Akagi | H02M 7/483 |
| 2010/0033993 A1 | 2/2010 | Kim et al. | |
| 2012/0007571 A1 | 1/2012 | Huisman | |
| 2012/0243280 A1 | 9/2012 | Liu et al. | |
| 2014/0146586 A1* | 5/2014 | Das | H02M 1/36 363/49 |
| 2015/0130464 A1 | 4/2015 | Huisman et al. | |
| 2015/0333612 A1 | 11/2015 | Hasler et al. | |
| 2017/0363698 A1* | 12/2017 | Lin | G01R 33/3852 |
| 2018/0123474 A1* | 5/2018 | Tremblay | H02M 1/4233 |

OTHER PUBLICATIONS

Pereda, J. ; Dixon, J, "High-Frequency Link: A Solution for Using Only One DC Source in Asymmetric Cascaded Multilevel Inverters",Industrial Electronics, IEEE Transactions on Industrial Electronics 58(9):3884-3892—Sep. 2011.

Watanabe, S. ; Takano, H. ; Boyagoda, P. ; Nakaoka, M. , "Advanced digital control scheme of two-paralleled bridge type current tracking power conversion amplifier for magnetic resonance imaging" Power Electronics and Drive Systems, 1997.

Peterchev, A.V. ; Sanders, S.R. "Quantization resolution and limit cycling in digitally controlled PWM converters" Power Electronics, IEEE Transactions on vol. 18 , Jan. 2003.

Sabate, J. ; Garces, L. ; Szczesny, P. ; Qiming Li ; Wirth, W.F, "High-bandwidth high-power gradient driver for magnetic resonance imaging with digital control" Applied Power Electronics Conference and Exposition, 2005. APEC 2005. Twentieth Annual IEEE.

Choi, U. ; Lee, K ; Blaabjerg, F, "Diagnosis and Tolerant Strategy of an Open-Switch Fault for T-type Three-Level Inverter Systems" Industry Applications, IEEE Transactions on Industry Applications, vol. 50, No. 1, Jan. 2014.

Sabate et al "High Power High Fidelity Switching Amplifier Driving Gradient Coils for MRI Systems" 2004 35th Annual IEEE Power Electronics Specialists Conference, Aachen, DE 2004.

* cited by examiner

MULTI-LEVEL INVERTER AND METHOD FOR PROVIDING MULTI-LEVEL OUTPUT VOLTAGE BY UTILIZING THE MULTI-LEVEL INVERTER

CROSS REFERENCE TO RELATED APPLICATIONS

This application is a U.S. national phase application of International Application No. PCT/EP2015/072478, filed on Sep. 29, 2015, which claims the benefit of CN application Serial No. PCT/CN2014/087796 filed Sep. 29, 2014 and EP Application Serial No. 14197383.4 filed on Dec. 11, 2014 and are incorporated herein by reference.

FIELD OF THE INVENTION

The invention relates to an inverter and in particular to a multi-level inverter and a method for providing multi-level output voltage by the multi-level inverter.

BACKGROUND OF THE INVENTION

A gradient coil is used in magnetic resonance imaging (MRI). A current of the gradient coil has to reach accuracy of tens of ppm over several hundred amperes for imaging requirement. For example, as shown in current profile 100 of FIG. 1, the current Icoil of the gradient coil needs to change from −180 A to +180 A in a short duration (ms range).

In order to accurately control the current of the gradient coil, a gradient amplifier is required to provide an accurate voltage to the gradient coil, wherein the gradient amplifier needs to provide a high voltage during a current transient state in which the current Icoil of the gradient coil changes from one level to another level, and to provide a low voltage during a current steady state in which the current Icoil of the gradient coil remains at a certain level. For example, as shown on FIG. 1, a state in which the current Icoil of the gradient coil changes from −180 A to 180 A or from 180 A to −180 A is the current transient state, and a state in which the current Icoil of the gradient coil remains at either −180 A or 180 A is the current steady state.

However, the conventional gradient amplifier generally generates high frequency harmonics. Therefore, as shown in FIG. 2A, an electromagnetic interference (EMI) filter 220 is needed between the gradient amplifier 210 and the gradient coil 230 to remove the high frequency harmonics generated by the gradient amplifier 210. As shown in FIG. 2B, the conventional EMI filter 220 usually includes two inductors L1, L2, two damping resistors R1 and three capacitors C1, C2, C3.

Up to now, different topologies have been proposed for the gradient amplifier, among which the gradient amplifier with a cascaded H bridge (CHB) topology is widely used in the industry. The existing gradient amplifier 210 with the CHB topology consists of one conventional two-level inverter or more cascaded conventional two-level inverters. FIG. 3 shows a schematic diagram of the conventional two-level inverter 300. As shown in FIG. 3, the conventional two-level inverter 300 includes a first half bridge leg 310 formed by switches QAH and QAL coupled in series and a second half bridge leg 320 formed by switches QBH and QBL coupled in series, wherein the first half bridge leg 310 and the second half bridge leg 320 are connected in parallel to a direct current power supply 330 with a voltage Vbus. The conventional two-level inverter 300 provides an output voltage VAB that is a difference between a voltage VA outputted by the first half bridge leg 310 at a node A located between the switches QAH and QAL and a voltage VB outputted by the second half bridge leg 320 at a node B located between the switches QBH and QBL.

However, in the conventional gradient amplifier 210 consisting of two-level inverter(s), rich high frequency harmonics are usually generated therein. Therefore, in order to attenuate the rich high frequency harmonics generated by the gradient amplifier 210, large inductance values for the inductors L1, L2 included in the EMI filter 220, large resistance values for the damping resistors R1 included in the EMI filter 220 and large capacitance value for the capacitors C1, C2, C3 included in the EMI filter 220 are required. However, large resistance values for the damping resistors R1 result in poor filter efficiency, and furthermore large inductance values for the inductors L1, L2 and large capacitance value for the capacitors C1, C2, C3 would affect overall system control bandwidth.

Further, referring back to FIG. 2A, the gradient coil 230 needs to be connected to ground 240 for purpose of safety and EMI shielding requirement, and thus there is a large overlap area between the gradient coil 230 and the ground 240 which leads to a large stray capacitance Cstray. Since the gradient amplifier 210 has great change in output voltage during operation, a large common mode current Istray flows through the stray capacitance Cstray. The common mode current Istray will be sensed by a high precision current sensor 250 placed between the gradient coil 230 and the EMI filter 220, and act as a high frequency disturbance which results in instability during operation of the MRI system.

Further, the current of the gradient coil 230 will fluctuate in large amplitude because the gradient amplifier 210 has great change in output voltage, which leads to high current ripple of the gradient coil 230.

SUMMARY OF THE INVENTION

Therefore, in view of the above-mentioned shortcomings in the conventional gradient amplifier consisting of two-level inverter(s), there is a need for a novel gradient amplifier with an improved performance.

To this end, the inventors of the present invention have conducted a large number of experiments, and found that the deficiencies in the conventional gradient amplifier 210 are due to the two-level inverter utilized therein, which has great change in output voltage, and in turn results in that rich high frequency harmonics are generated by the conventional gradient amplifier 210.

Accordingly, the present invention provides a multi-level inverter and a method for providing a multi-level output voltage by the multi-level inverter to address the previously mentioned problems.

In accordance with a first aspect of the invention, it proposes a multi-level inverter, comprising: at least one cascaded H bridge multi-level module, wherein each H bridge multi-level module comprises a first H bridge multi-level leg having a plurality of output levels at an output terminal of the first H bridge multi-level leg and a second H-bridge multi-level leg having a plurality of output levels at an output terminal of the second H bridge multi-level leg, wherein the first and second H bridge multi-level legs are connected in parallel and multi-level outputs of the H bridge multi-level module are outputted between the output terminals of the first and second H bridge H bridge multi-level legs, wherein each of the first and second H bridge multi-level legs comprises a first inverter leg and a second inverter leg coupled in parallel through a coupled inductor, the first inverter leg is coupled to a primary winding of the coupled inductor for providing a first input voltage with multiple voltage levels, the second inverter leg is coupled to a secondary winding of the coupled inductor for providing a second input voltage with multiple voltage levels, the primary and secondary windings of the coupled inductor are coupled in series and a junction node of the primary and secondary windings coupled in series forms the output terminal of the H bridge multi-level leg, wherein the first input voltage has a predetermined phase shift relative to the second input voltage.

In this way, since each of the first H bridge multi-level leg and the second H bridge multi-level leg of each H bridge multi-level module outputs a multi-level output voltage, the multi-level inverter can have lower change in output voltage and thus eliminates the problems caused by the great change in output voltage.

In an embodiment of the invention, each of the first and second inverter legs comprises a half-bridge leg with a high side switch and a low side switch coupled in series, drive signals for the high side switches in the first and second inverter legs of the first H bridge multi-level leg have the predetermined phase shift relative to each other and drive signals for the low side switches in the first and second inverter legs of the second H bridge multi-level leg have the predetermined phase shift relative to each other. In this way, that the first input voltage provided by the first inverter leg has the predetermined phase shift relative to the second input voltage provided by the second inverter leg is enabled. In an embodiment of the invention, M H bridge multi-level modules are cascaded and the output of each H bridge multi-level module has a 360°/M phase shift relative to adjacent H bridge multi-level module, wherein M is an integer equal or greater than 2.

In this way, the multi-level inverter can provide increased equivalent switching frequency and thus brings reduced current ripple.

In accordance with a second aspect of the invention, it proposes a method for providing multi-level output voltage by a multi-level inverter, wherein the multi-level inverter comprises at least one cascaded H bridge multi-level module, wherein each H bridge multi-level module comprises a first H bridge multi-level leg and a second H-bridge multi-level leg connected in parallel and an output voltage of the H bridge multi-level module are outputted between output terminals of the first and second H bridge multi-level legs, wherein each of the first and second H bridge multi-level legs comprises a first inverter leg and a second inverter leg coupled in parallel through a coupled inductor, the first inverter leg is coupled to a primary winding of the coupled inductor, the second inverter leg is coupled to a secondary winding of the coupled inductor, the primary and secondary windings of the coupled inductor are coupled in series and a junction node of the primary and secondary windings coupled in series forms the output terminal of the H bridge multi-level leg, the method comprising: generating, by the first inverter leg of the first H bridge multi-level leg of each H bridge multi-level module, a first voltage with multiple levels; generating, by the second inverter leg of the first H bridge multi-level leg of each H bridge multi-level module, a second voltage with multiple levels that has a predetermined phase shift relative to the first voltage; generating, by the first H bridge multi-level leg of each H bridge multi-level module, a third voltage with multiple levels based on the generated first and second voltages; generating, by the first inverter leg of the second H bridge multi-level leg of each H bridge multi-level module, a fourth voltage with multiple levels; generating, by the second inverter leg of the second H bridge multi-level leg of each H bridge multi-level module, a fifth voltage with multiple levels that has the predetermined phase shift relative to the fourth voltage; generating, by the second H bridge multi-level leg of each H bridge multi-level module, a sixth voltage with multiple levels based on the generated fourth and fifth voltages; generating, by each H bridge multi-level module, a multi-level output voltage based on the generated third and sixth voltages; and providing a multi-level output voltage of the multi-level inverter based on the multi-level output voltage outputted by each H bridge multi-level module.

As mentioned above, the method for providing multi-level output voltage by a multi-level inverter according to the invention may lower change in output voltage provided by the multi-level inverter and thus eliminate the problems caused by the great change in output voltage.

In accordance with a third aspect of the invention, it proposes a multi-level inverter comprising: n H bridge multi-level legs, each of which has at least one cascaded H bridge inverter, wherein n is an integer larger than 1; and a coupled inductor having n windings coupled together at a junction node of the n windings, wherein the n H bridge multi-level legs are coupled in parallel through the coupled inductor, and wherein each of the n H bridge multi-level legs is coupled to one of the n windings for providing an input voltage with multiple voltage levels, and the junction node forms an output terminal of the multi-level inverter for providing multi-level output levels, and wherein the input voltages provided by the n H bridge multi-level legs have a phase shift relative to each other.

In this way, the multi-level inverter can provide lower change in output voltage and meanwhile can have lower cost and be more compact because only one coupled inductor is used by the multi-level inverter.

In an embodiment of the invention, the at least one cascaded H bridge inverter comprises at least one powered H bridge inverter and at least one floating H bridge inverter. In this way, the multi-level inverter can need less power supplies.

In accordance with a fourth aspect of the invention, it proposes a method for providing a multi-level output voltage by a multi-level inverter, wherein the multi-level inverter comprising n H bridge multi-level legs and a coupled inductor, wherein n is an integer larger than 1, and wherein each of the n H bridge multi-level legs has at least one cascaded H bridge inverter and the coupled inductor has n windings coupled together at a junction node of the n windings, and wherein the n H bridge multi-level legs are coupled in parallel through the coupled inductor, and wherein each of the n H bridge multi-level legs is coupled to one of the n windings, and the junction node forms an output terminal of the multi-level inverter, the method comprising: generating, by the n H bridge multi-level legs, n voltages each of which has multiple voltage levels, wherein the n voltages has a phase shift relative to each other; and providing a multi-level output voltage outputted by the multi-level inverter based on the generated n voltages.

In this way, the multi-level inverter can have lower change in output voltage and meanwhile can lower the cost and be more compact because only one coupled inductor is needed by the multi-level inverter.

In accordance with a fifth aspect of the invention, it proposes a multi-level inverter comprising: n H bridge multi-level legs, each of which has at least one cascaded H bridge inverter, wherein n is an integer larger than 1; and a split set of coupled inductors symmetrically coupled to both sides of the n H bridge multi-level legs, each of the coupled inductor set having n windings coupled together at a junction node of the n windings, wherein each of the n H bridge multi-level legs is coupled between one of the n windings of one coupled inductor of the coupled inductor set and one of the n windings of another coupled inductor of the coupled inductor set for providing an input voltage with multiple voltage levels, and the junction nodes in the coupled inductor set form output terminals of the multi-level inverter for providing multi-level output levels, and wherein the input voltages provided by the n H bridge multi-level legs have a phase shift relative to each other.

In this way, the multi-level inverter can have lower change in output voltage, and meanwhile can meet galvanic isolation requirements and electro magnetic compatibility (EMC) because of usage of the split set of coupled inductors.

In an embodiment of the invention, the at least one cascaded H bridge inverter comprises at least one powered H bridge inverter and at least one floating H bridge inverter. In this way, the multi-level inverter can need less power supplies.

In accordance with a sixth aspect of the invention, it proposes a method for providing a multi-level output voltage by a multi-level inverter, wherein the multi-level inverter comprising n H bridge multi-level legs and a split set of coupled inductors, wherein n is an integer larger than 1, and wherein each of the n H bridge multi-level legs has at least one cascaded H bridge inverter, and the split set of coupled inductors are symmetrically coupled to both sides of the n H bridge multi-level legs, and wherein each of the coupled inductor set has n windings coupled together at a junction node of the n windings, wherein each of the n H bridge multi-level legs is coupled between one of the n windings of one coupled inductor of the coupled inductor set and one of the n windings of another coupled inductor of the coupled inductor set, and the junction nodes in the coupled inductor set form output terminals of the multi-level inverter, the method comprising: generating, by the n H bridge multi-level legs, n voltages each of which has multiple voltage levels, wherein the n voltages has a phase shift relative to each other; and providing a multi-level output voltage outputted by the multi-level inverter based on the generated n voltages.

In this way, the multi-level inverter can provide lower change in output voltage, and meanwhile can meet galvanic isolation requirements and electro magnetic compatibility (EMC) because of usage of the split set of coupled inductors.

BRIEF DESCRIPTION OF THE DRAWINGS

In the following various embodiments of the invention will be described, by way of example only, with reference to the drawings in which.

DETAILED DESCRIPTION

Figure 1:
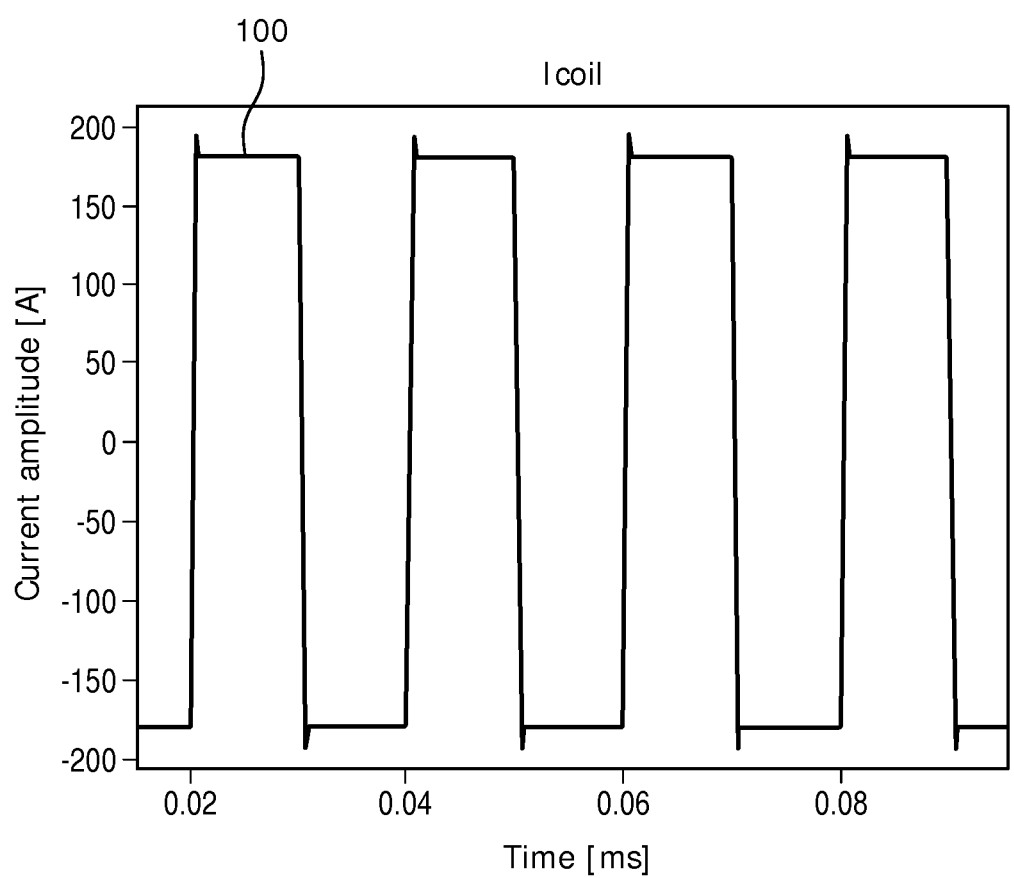
FIG. 1 shows a schematic diagram of a typical current profile of the gradient coil.
Figure 2A:
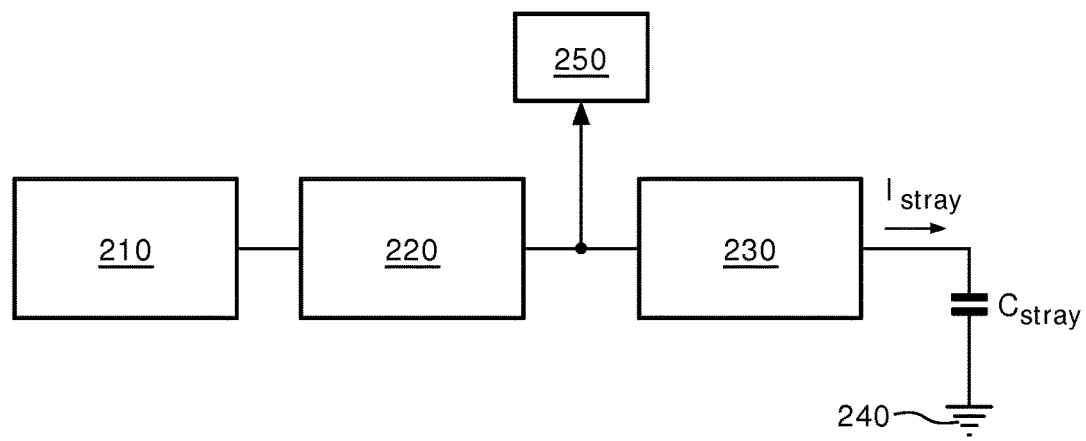
FIG. 2A shows a schematic diagram of a connection relationship among the gradient amplifier, the EMI filter and the gradient coil.
Figure 2B:
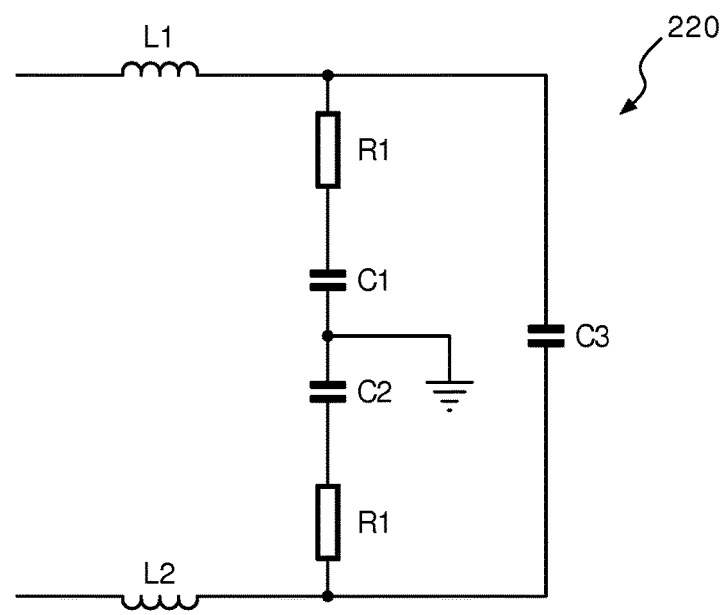
FIG. 2B shows a schematic circuit diagram of the EMI filter.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

As mentioned above, the inventors of the present invention have conducted a large number of experiments, and found that the deficiencies in the conventional gradient amplifier 210 are due to the two-level inverter utilized therein, which has great change in output voltage, and in turn results in that rich high frequency harmonics are generated by the conventional gradient amplifier 210.

Figure 4A:
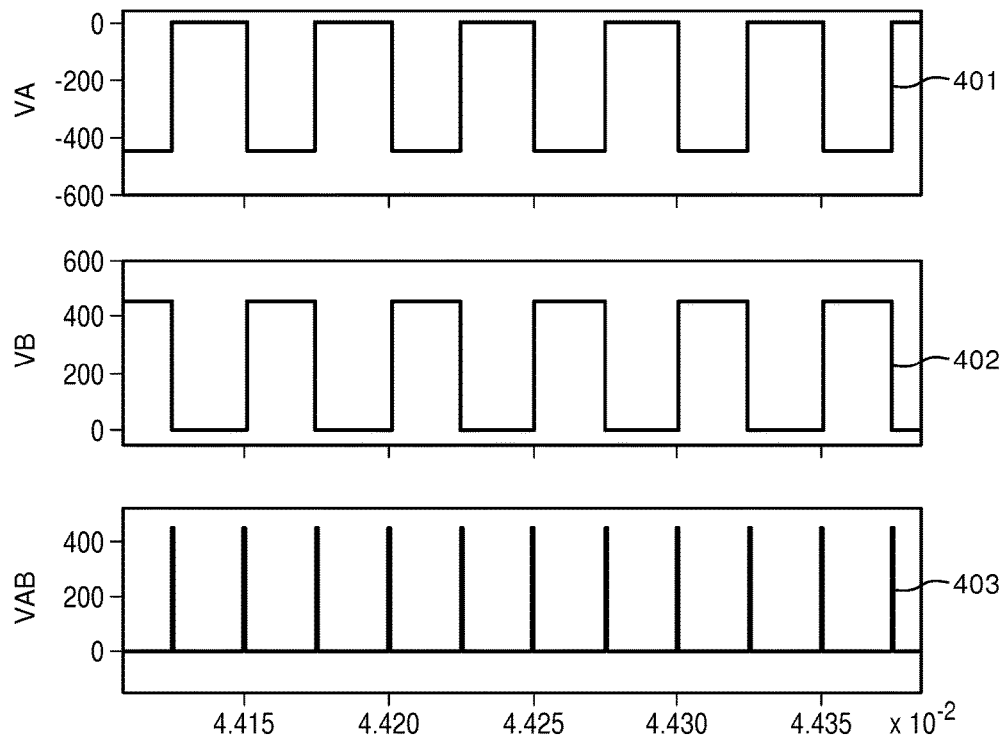
FIG. 4A shows waveforms of voltages VA, VB outputted by the two half bridge legs of the conventional two-level inverter and a voltage VAB outputted by the conventional two-level inverter in the current steady state.

Specifically, FIG. 4A shows schematic diagrams of the voltages VA and VB outputted by the two half bridge legs of the conventional two-level inverter 300 and the voltage VAB outputted by the conventional two-level inverter 300 in the current steady state, wherein Vbus is selected to be 450 v as an example. As shown in FIG. 4A, each of the voltages VA and VB (which are represented by 401 and 402 respectively) outputted by the first and second half bridge legs 310, 320 of the conventional two-level inverter 300 in the current steady state has two output levels 0 v and Vbus, and the voltage VAB outputted by the conventional two-level inverter 300 in the current steady state, which is represented by 403, has two output levels 0 v and Vbus as well and includes two voltage pulses within each period.

Figure 4B:
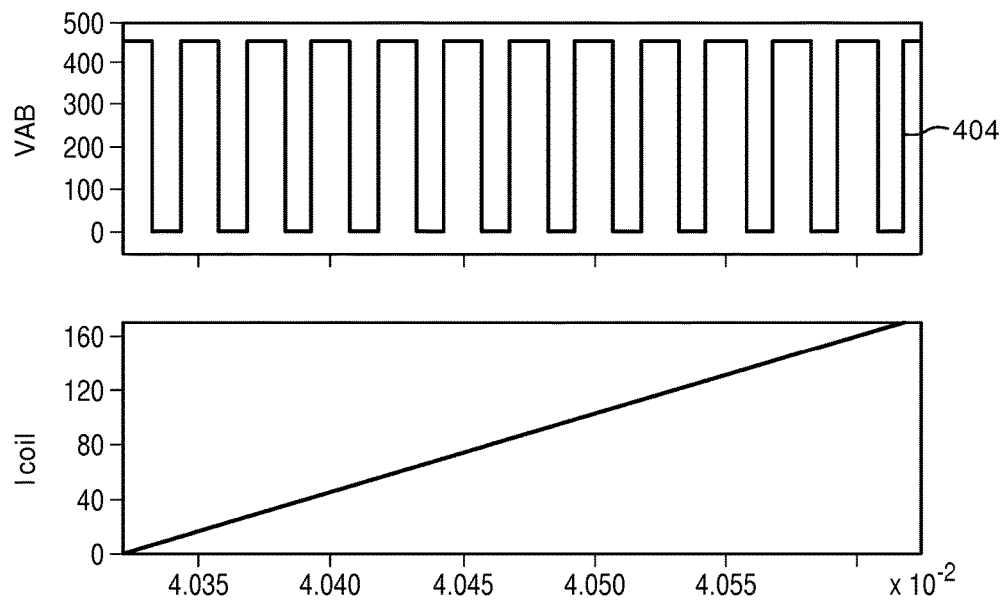
FIG. 4B shows waveform of a voltage VAB outputted by the conventional two-level inverter in the current transient state.

Furthermore, FIG. 4B shows a schematic diagrams of the voltage VAB outputted by the conventional two-level inverter 300 in the current transient state, wherein Vbus is selected to be 450 v as an example. As shown in FIG. 4B, the voltage VAB outputted by the conventional two-level inverter 300 in the current transient state, which is represented by 404, has two output levels 0 v and Vbus and includes two voltage pulses within each period.

As can seen from FIG. 4A and FIG. 4B, the voltage VAB outputted by the conventional two-level inverter 300 toggles from 0 v to Vbus or vice versa in each transition, i.e., the voltage VAB outputted by the conventional two-level inverter 300 alters an amount of Vbus each time, and thus the conventional two-level inverter 300 has a large amount of change (in this example, 450 v–0 v=450 v) in output voltage. Accordingly, the gradient amplifier 210 formed by the conventional two-level inverter 300 also has great change in output voltage, which results in that rich high frequency harmonics are generated by the gradient amplifier 210.

Accordingly, in view of the insight by the present inventors, the present invention provides a multi-level inverter, which has output levels equal to or more than two and thus has lower change in output voltage compared with the existing gradient amplifier formed by the conventional two-level inverter(s) and can thus solve the problems caused by the great change in output voltage in the existing gradient amplifier.

Below, various embodiments of the invention will be described in detail in conjunction with the drawings.

The First Embodiment

Figure 5:
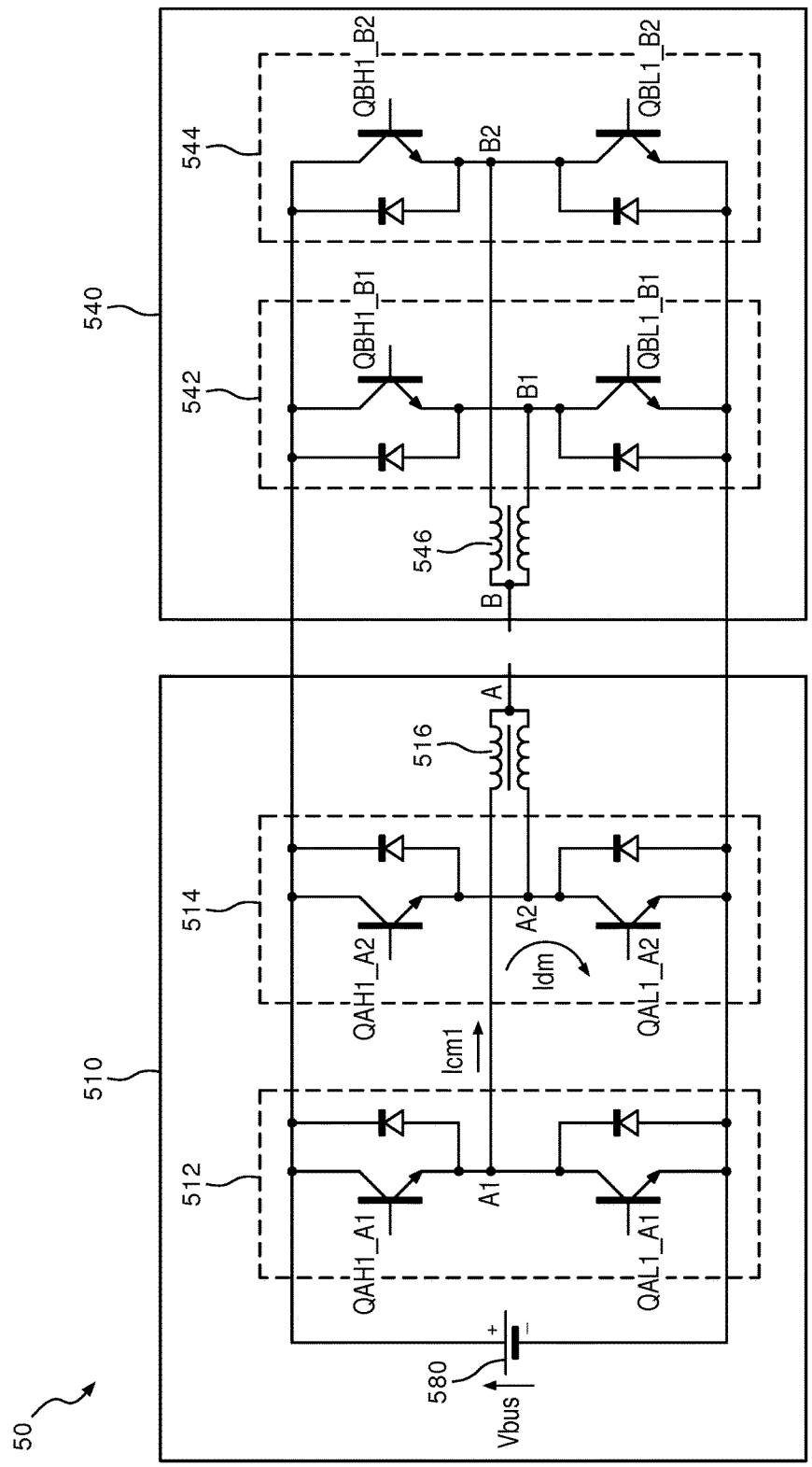
FIG. 5 shows a schematic diagram of an H bridge multi-level module according to a first embodiment of the invention.

FIG. 5 shows a schematic diagram of an H bridge multi-level module 50 according to a first embodiment of the invention. As shown in FIG. 5, the H bridge multi-level module 50 may include an H bridge multi-level leg A 510 and an H bridge multi-level leg B 540, wherein the H bridge multi-level leg A 510 and the H bridge multi-level leg B 540 are connected in parallel to a direct current power supply 580 having a voltage Vbus. In the first embodiment, Vbus is selected to be 450 v as an example. However, it is readily occur to the skilled in the art that Vbus may have other values as needed.

The H bridge multi-level leg A 510 may include a first inverter leg 512, a second inverter leg 514 and a coupled inductor 516. As acknowledged by the skilled in the art, any inductor or transformer with multiple windings is referred to as a coupled inductor.

The first inverter leg 512 and the second inverter leg 514 are connected in parallel to the direct current power supply 580. The first inverter leg 512 is a half bridge leg formed by a high side switch QAH1_A1 and a low side switch QAL1_A1, and the switches QAH1_A1 and QAL1_A1 are coupled in series.

The second inverter leg 514 is a half bridge leg formed by a high side switch QAH1_A2 and a low side switch QAL1_A2, and the switches QAH1_A2 and QAL1_A2 are coupled in series.

Figure 6:
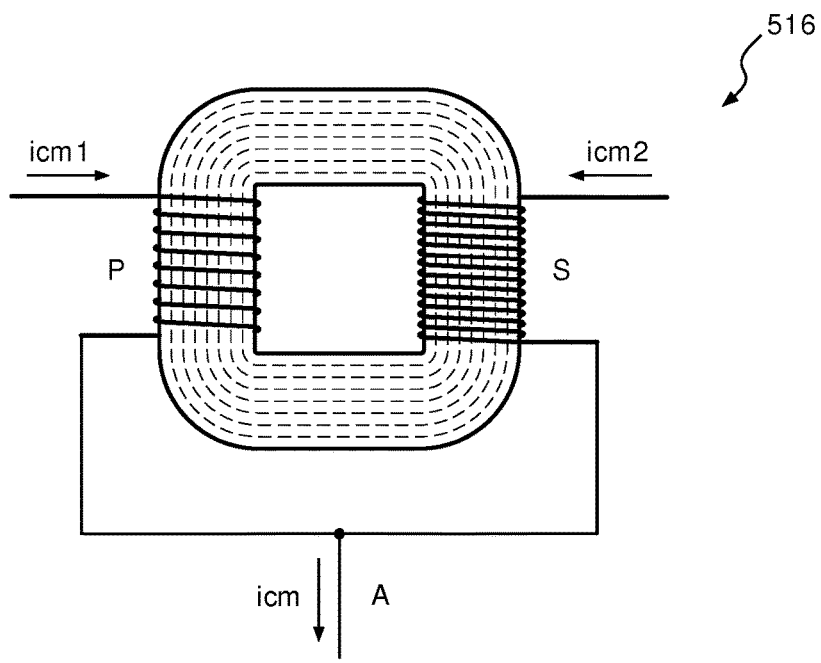
FIG. 6 shows a schematic diagram of a coupled inductor according to the first embodiment of the invention.

As shown in FIG. 6, the coupled inductor 516 may include a primary winding p and a secondary winding s wrapped around a magnetic core. The primary winding p and the secondary winding s are coupled in series and have a junction node A. A current icm flowing through the junction node A is a sum of a current icm1 flowing through the primary winding p of the coupled inductor 516 and a current icm2 flowing through the secondary winding s of the coupled inductor 516. Since the primary winding p and the secondary winding s of the coupled inductor 516 are coupled in series, magnetic flux created by the current icm1 and the current icm2 will counteract each other if the current icm1 is the same as the current icm2 and thus the coupled inductor 516 behaves as a resistor.

Referring back to FIG. 5, A node A1 between the high side switch QAH1_A1 and the low side switch QAL1_A1 of the first inverter leg 512 is connected to the primary winding p of the coupled inductor 516, and a node A2 located between the high side switch QAH1_A2 and the low side switch QAL1_A2 of the second inverter leg 514 is connected to the secondary winding s of the coupled inductor 516. The junction node A of the coupled inductor 516 forms an output terminal of the H bridge multi-level leg A 510.

Similarly, the H bridge multi-level leg B 540 may include a first inverter leg 542, a second inverter leg 544 and a coupled inductor 546.

The first inverter leg 542 and the second inverter leg 544 are connected to the direct current power supply 580 in parallel. The first inverter leg 542 is a half bridge leg formed by a high side switch QBH1_B1 and a low side switch QBL1_B1, and the switches QBH1_B1 and QBL1_B1 are coupled in series.

The second inverter leg 544 is a half bridge leg formed by a high side switch QBH1_B2 and a low side switch QBL1_B2, and the switches QBH1_B2 and QBL1_B2 are coupled in series.

The coupled inductor 546, which is the same as the coupled inductor 516, may include a primary winding and a secondary winding coupled in series and have a junction node B of the primary winding and the secondary winding. A node B1 located between the switches QBH1_B1 and QBL1_B1 of the first inverter leg 542 is connected to the primary winding of the coupled inductor 546, and a node B2 located between the switches QBH1_B2 and QBL1_B2 of the second inverter leg 544 is connected to the secondary winding of the coupled inductor 546. The junction node B may form an output terminal of the H bridge multi-level leg B 540.

The output terminals of the H bridge multi-level leg A 510 and the H bridge multi-level leg B 540 form output terminals of the H bridge multi-level module 50. Each of the switches QAH1_A1, QAL1_A1, QAH1_A2, QAL1_A2, QBH1_B1, QBL1_B1, QBH1_B2, QBL1_B2 is formed by a power transistor (e.g., an insulated gate bipolar transistor (IGBT), a metal-oxide-semiconductor field-effect transistor (MOSFET), a thyristor or the like) and a diode, and the switches QAH1_A1, QAL1_A1, QAH1_A2, QAL1_A2, QBH1_B1, QBL1_B1, QBH1_B2, QBL1_B2 may have the same voltage and current ratings.

Figure 7:
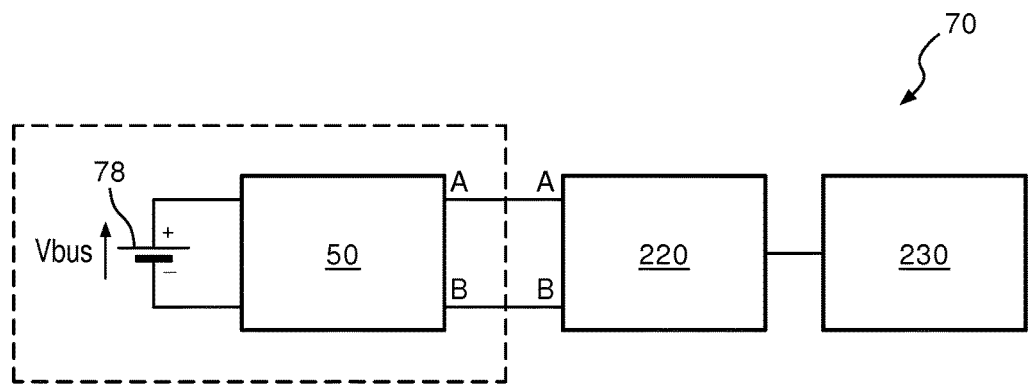
FIG. 7 shows a schematic diagram of a multi-level inverter according to the first embodiment of the invention.

FIG. 7 shows a schematic diagram of a multi-level inverter 70 according to the first embodiment of the invention. As shown in FIG. 7, the multi-level inverter 70 may include one H bridge multi-level module 50 described above, wherein the H bridge multi-level module 50 is connected to a direct current power supply 78 with voltage Vbus. As shown in FIG. 7, the multi-level inverter 70 is connected to the gradient coil 230 via the EMI filter 220.

In the following, the principle of the H bridge multi-level module 50, i.e., the method for providing multi-level output voltage by utilizing the multi-level inverter will be explained in conjunction with FIG. 8, which shows a flow chart of a method 800 for providing a multi-level output voltage by the multi-level inverter 70 according to the first embodiment of the invention.

Figure 8:
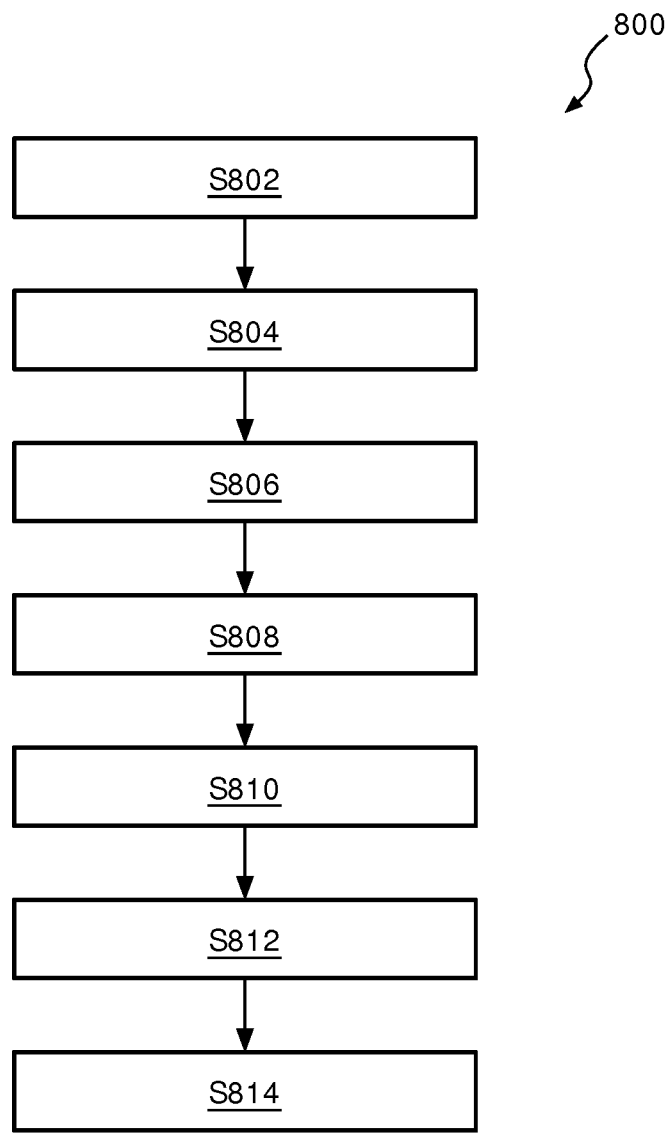
FIG. 8 shows a flow chart of a method for providing a multi-level output voltage by the multi-level inverter according to the first embodiment of the invention.
Figure 9A:
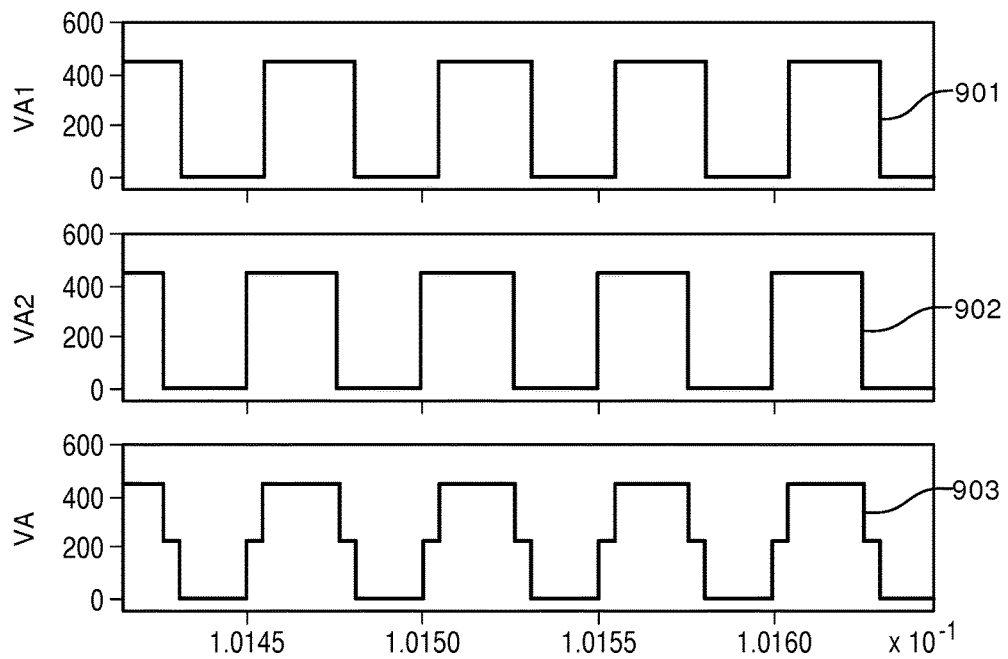
FIG. 9A shows waveforms of voltages VA1, VA2 and VA according to the first embodiment of the invention.

As shown in FIG. 8, at step S802, the first inverter leg 512 of the H bridge multi-level module 50 in the multi-level inverter 70 generates a voltage VA1 at the node A1 of the first inverter leg 512 under the condition that drive signals for the high side switch QAH1-A1 and the low side switch QAL1-A1 of the first inverter leg 512 are modulated such that the drive signals for the two switches are complementary. The voltage VA1 is inputted into the primary winding of the coupled inductor 516 of the H bridge multi-level module 50 of the multi-level inverter 70. As shown in FIG. 9A, the voltage VA1 that is represented by 901 has two output levels 0 v and Vbus, wherein as stated above, Vbus is 450 v as an example.

At step S804, the second inverter leg 514 generates a voltage VA2 at the node A2 of the second inverter leg 514 under the condition that drive signals for the high side switch QAH1-A2 and the low side switch QAL1-A2 of the second inverter leg 514 are modulated such that the drive signal for the two switches are complementary, the drive signal for the high side switch QAH1-A2 has the same duty cycle as that of the drive signal for the high side switch QAH1-A1 and the drive signal for the high side switch QAH1-A2 has θ phase shift with respect to the drive signal for the high side switch QAH1-A1. The voltage VA2 is inputted into the secondary winding of the coupled inductor 516 of the H bridge multi-level module 50 of the multi-level inverter 70. As shown in FIG. 9A, the voltage VA2 that is represented by 902 has two output levels 0 v and Vbus. Since the drive signal for the high side switch QAH1-A2 has the θ phase shift with respect to the drive signal for the high side switch QAH1-A1, the voltage VA2 has the θ phase shift with respect to the voltage VA1.

At step S806, the H bridge multi-level leg A 510 of the H bridge multi-level module 50 in the multi-level inverter 70 generates a voltage VA at the node A based on the voltages VA1 and VA2. In this embodiment, turn ratio of the primary and secondary windings of the coupled inductor 516 is 1:1, and thus the voltage VA is calculated according to Equation 1.

$$VA=(VA1+VA2)/2 \quad \text{(Equation 1)}$$

Since the voltage VA2 has the θ phase shift with respect to the voltage VA1, the voltage VA that is represented by 903 has three levels 0 v, ½Vbus and Vbus as shown in FIG. 9A.

Figure 9B:
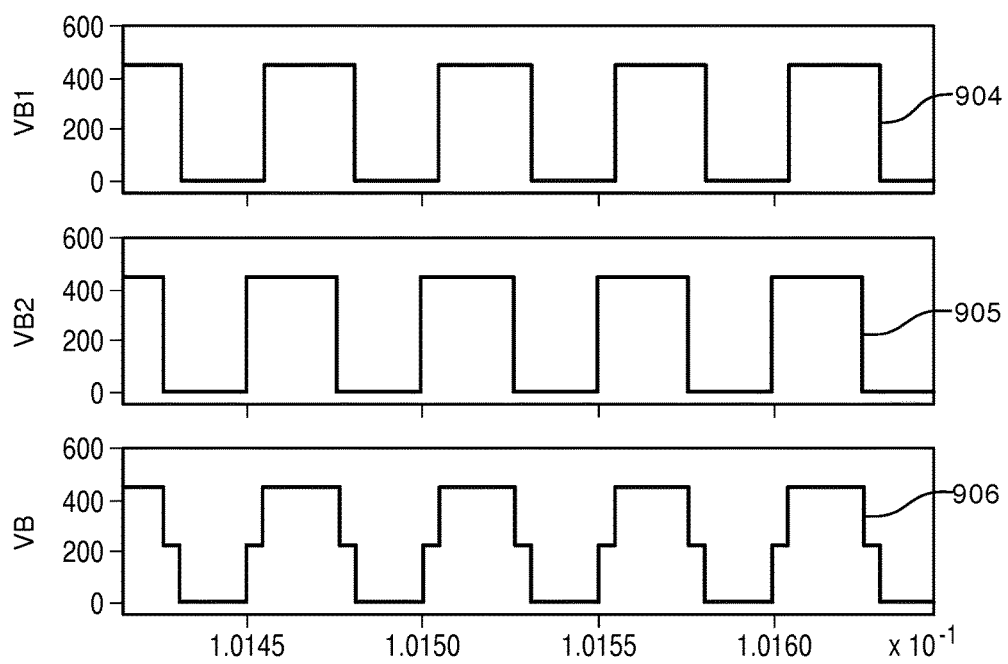
FIG. 9B shows waveforms of voltages VB1, VB2 and VB according to the first embodiment of the invention.

At step S808, the first inverter leg 542 of the H bridge multi-level module 50 in the multi-level inverter 70 generates a voltage VB1 at the node B1 of the first inverter leg 542 under the condition that drive signals for the high side switch QBH1-B1 and the low side switch QBL1-B1 of the first inverter leg 542 are modulated such that the drive signal for the two switches are complementary, the drive signal for the low side switch QBL1-B1 has the same duty cycle as that of the drive signal for the high side switch QAH1-A1 and the drive signal for the low side switch QBL1-B1 has 180° phase shift with respect to the drive signal for the high side switch QAH1-A1. The voltage VB1 is inputted into the primary winding of the coupled inductor 546 of the H bridge multi-level module 50 in the multi-level inverter 70. As shown in FIG. 9B, the voltage VB1 that is represented by 904 has two levels 0 v and Vbus, wherein as stated above, Vbus is 450 v as an example.

At step S810, the second inverter leg 544 of the H bridge multi-level module 50 of the multi-level inverter 70 generates a voltage VB2 at the node B2 of the second inverter leg 544 under the condition that drive signals for the high side switch QBH1-B2 and the low side switch QBL1-B2 of the second inverter leg 544 are modulated such that the drive signal for the two switches are complementary, the drive signal for the low side switch QBH1-B2 has the same duty cycle as that of the drive signal for the low side switch QBH1-B1 and the drive signal for the low side switch QBH1-B2 has the θ phase shift with respect to the drive signal for the low side switch QBH1-B1. The voltage VB2 is inputted into the secondary winding of the coupled inductor 546 of the H bridge multi-level module 50 in the multi-level inverter 70. As shown in FIG. 9B, the voltage VB2 that is represented by 905 has two output levels 0 v and Vbus. Since the drive signal for the high side switch QBH1-B2 has the θ phase shift with respect to the drive signal for the high side switch QBH1-B1, the voltage VB2 has the θ phase shift with respect to the voltage VB1.

At step S812, the H bridge multi-level leg B 540 of the H bridge multi-level module 50 in the multi-level inverter 70 generates a voltage VB at the node B by using the voltages VB1 and VB2. In this embodiment, turn ratio of the primary and secondary windings of the coupled inductor 546 is 1:1, and thus the voltage VB is calculated according to Equation 2.

$$VB=(VB1+VB2)/2 \quad \text{(Equation 2)}$$

Since the voltage VB2 has the θ phase shift with respect to the voltage VB1, the voltage VB that is represented by 906 has three output levels 0 v, ½Vbus and Vbus as shown in FIG. 9B.

At step S814, the H bridge multi-level module 50 in the multi-level inverter 70 generates an output voltage VAB that is a difference between the voltages VA and VB generated by the H bridge multi-level leg A 510 and the H bridge multi-level leg B 540 of the H bridge multi-level module 50.

In this embodiment, the duty cycle of the drive signal of the high side switch QAH1_A1 selected for the current steady state and the duty cycle of the drive signal of the high side switch QAH1_A1 selected for the current transient state are different. Consequently, the output voltage VAB generated by the H bridge multi-level module 50 in the current steady state, which is represented by 1001, has two output levels 0 v and ½Vbus and includes four voltage pulses within every period, as shown in FIG. 10A, whereas the output voltage VAB generated by the H bridge multi-level module 50 in the current transient state, which is represented by 1002, has three output levels 0 v, ½Vbus and Vbus and includes two voltage pulses within every period, as shown in FIG. 10B.

Since the multi-level inverter 70 includes one H bridge multi-level module 50 in this embodiment, the output voltage VAB generated by the H bridge multi-level module 50 of the multi-level inverter 70 is the output voltage VAB of the multi-level inverter 70.

Figure 10A:
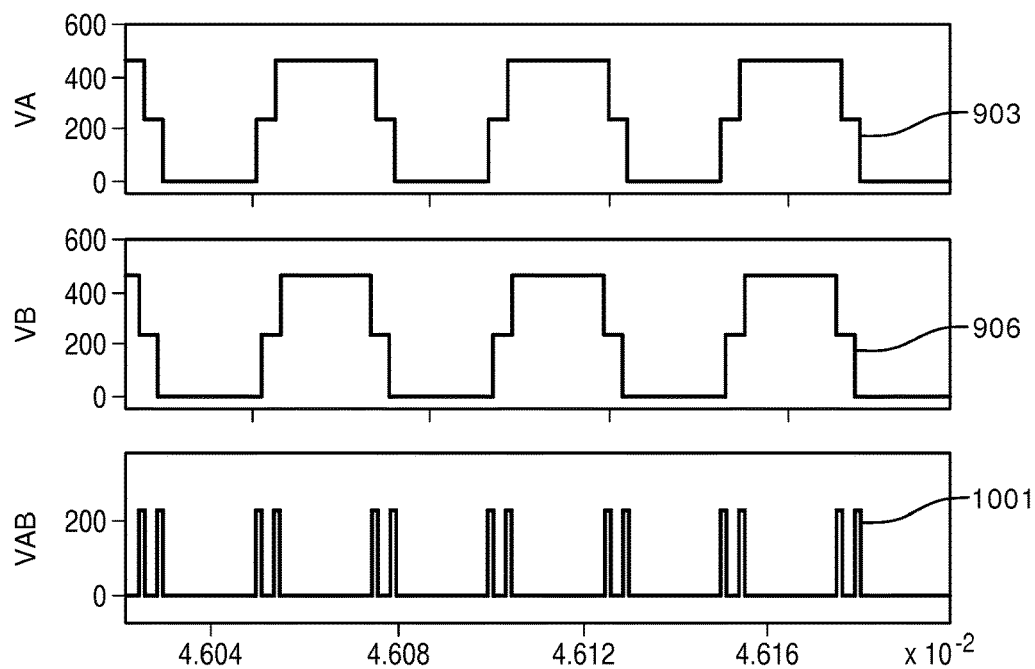
FIG. 10A shows waveform of an output voltage VAB generated by the multi-level inverter according to the first embodiment of the invention in the current steady state.
Figure 10B:
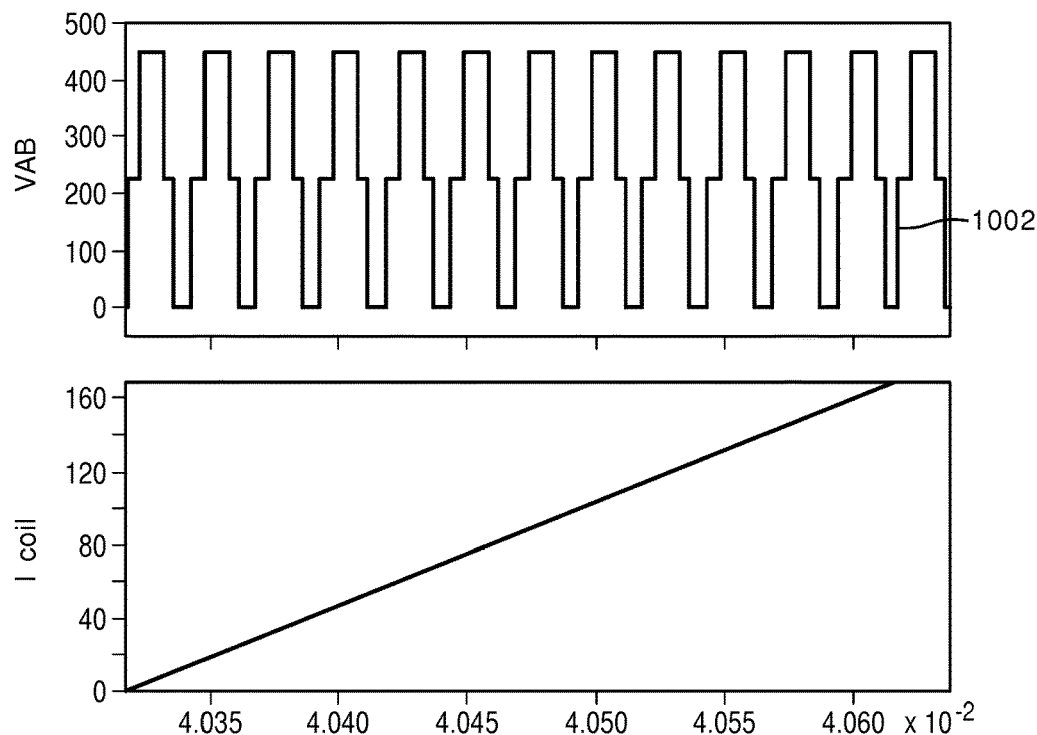
FIG. 10B shows waveform of an output voltage VAB generated by the multi-level inverter according to the first embodiment of the invention in the current transient state.

As can be seen from the above description, the θ phase shift between the voltages VA1 and VA2 and between the voltages VB1 and VB2 results in that each of the voltages VA and VB in the first embodiment has three output levels 0 v, ½Vbus and Vbus, and the voltages VA and VB with the three output levels 0 v, ½Vbus and Vbus result in that the output voltage VAB outputted by the multi-level inverter 70 in the current steady state toggles between 0 v and ½Vbus in each transition as shown in FIG. 10A, and the output voltage VAB outputted by the multi-level inverter 70 in the current transient state toggles between 0 v and ½Vbus or between ½Vbus and Vbus in each transition as shown in FIG. 10B.

Thus, the output voltage VAB outputted by the multi-level inverter 70 alters an amount of ½Vbus in each transition and thus has lower change in output voltage compared with the existing gradient amplifier. Since the output voltage VAB outputted by the multi-level inverter 70 has lower change in output voltage, less high frequency harmonics are generated by the multi-level inverter 70 and thus the EMI filter 220 for attenuating the high frequency harmonics generated by the multi-level inverter 70 may use damping resistors with lower resistance value, capacitors with low capacitance value and inductors with lower inductance value, which may improve filter efficiency of the EMI filter 220 and does not affect overall system control bandwidth. Further, the lower change in the output voltage for the multi-level inverter 70 will much lower the common mode current caused by the stray capacitance Cstray, which leads to much easier stabilization. Further, the lower change in the output voltage for the multi-level inverter 70 will also obtain reduced current ripple of the gradient coil 230.

Figure 3:
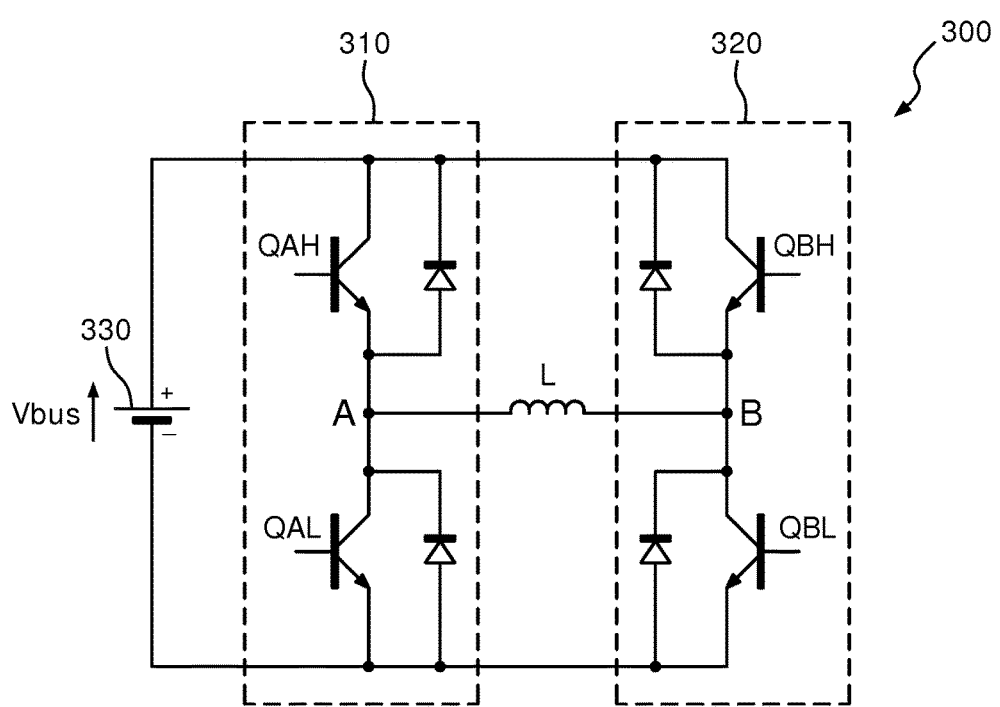
FIG. 3 shows a schematic diagram of the conventional two-level inverter.

In addition, the output voltage VAB generated by the multi-level inverter 70 in the current steady state includes four voltage pulses within every period and the output voltage VAB outputted by each two-level inverter of the existing gradient amplifier includes two voltage pulses within every period as shown in FIG. 3B, so the equivalent switching frequency of the multi-level inverter 70 in the current steady state is twice that of each two-level inverter of the existing gradient amplifier, and thus the multi-level inverter 70 will further provide in the current steady state less current ripple compared with the existing gradient amplifier.

Figure 11:
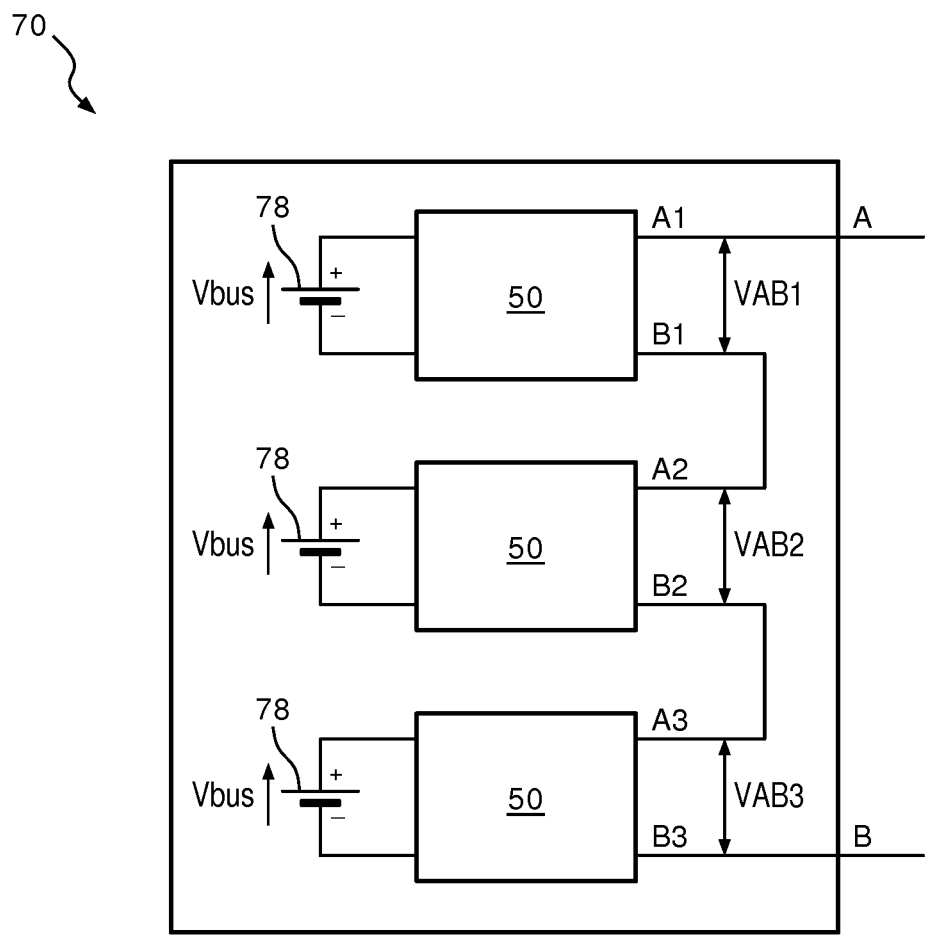
FIG. 11 shows a schematic diagram of the multi-level inverter consisting of three cascaded H bridge multi-level modules in accordance with a modification to the first embodiment.

It should be understood that in the first embodiment, the multi-level inverter 70 includes only one H bridge multi-level module 50, but the multi-level inverter 70 may also include a plurality of cascaded H bridge multi-level modules 50 when needed. FIG. 11 shows a schematic diagram of the multi-level inverter 70 consisting of three cascaded H bridge multi-level modules 50 in accordance with a modification to the first embodiment.

Figure 12:
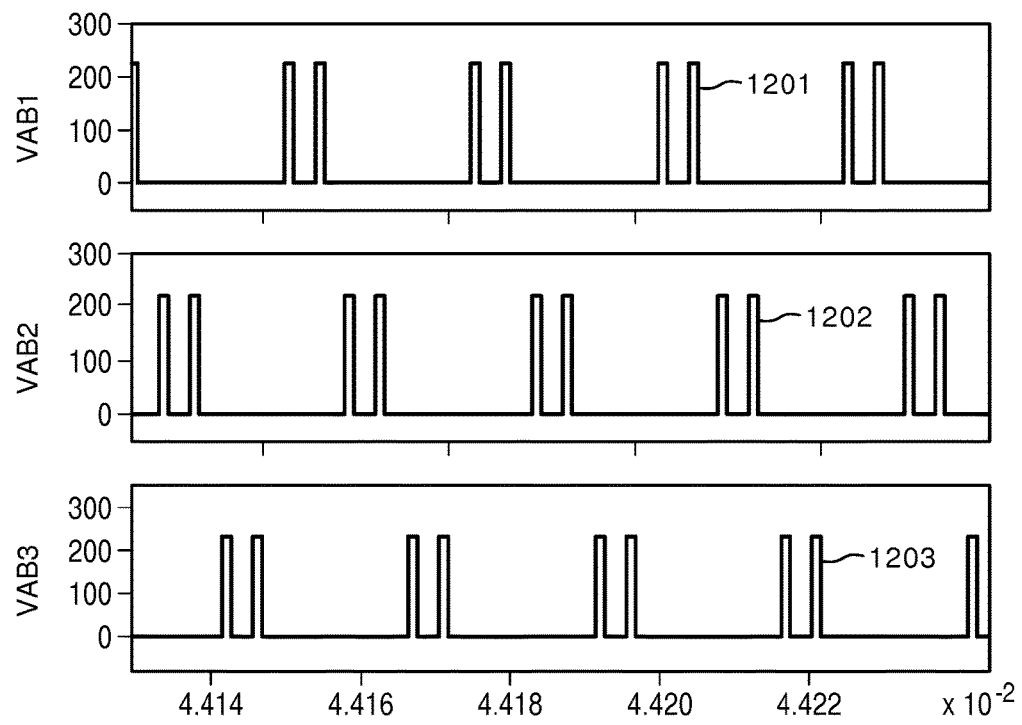
FIG. 12 shows waveforms of output voltages VAB1, VAB2 and VAB3 generated by the three H bridge multi-level modules of the multi-level inverter shown in FIG. 11 in the current transient state according to the first embodiment of the invention.

When the multi-level inverter 70 includes the plurality of cascaded H bridge multi-level modules 50, the switches included in the multi-level inverter 70 are modulated such that the voltage generated by each H bridge multi-level module of the multi-level inverter 70 has 360°/n phase shift relative to the voltage generated by an adjacent H bridge multi-level module of the multi-level inverter 70 (n is the number of cascaded H bridge multi-level modules 50 included in the multi-level inverter 70). FIG. 12 shows a schematic diagram of the voltages generated by the three cascaded H bridge multi-level modules 50 of the multi-level inverter 70 shown in FIG. 11 in the current steady state, wherein 1201, 1202 and 1203 represent the voltages VAB1, VAB2, VAB3 generated by the three cascaded H bridge multi-level modules 50 respectively.

The 360°/n phase shift between any two adjacent H bridge multi-level modules 50 of the multi-level inverter 70 will result in that voltage pulses generated by the H bridge multi-level modules 50 of the multi-level inverter 70 are distributed evenly into the output voltage VAB generated by the multi-level inverter 70. Thus, the output voltage VAB generated by the multi-level inverter 70 will include more voltage pulses with every period, which results in that the multi-level inverter 70 provides larger equivalent switching frequency and can thus reduce current ripple of the gradient coil 230.

It should be understood that in the first embodiment, the turn ratio of the primary and secondary windings of each of the coupled inductors 516, 546 is 1:1, but the turn ratio of the primary and secondary windings of each of the coupled inductors 516, 546 may also be n1:n2, wherein n1 and n2 are integers different from each other. In this case, the voltages VA and VB are calculated according to the following equations:

$$VA=(VA1*n1+VA2*n2)/(n1+n2)$$

and $$VB=(VB1*n1+VB2*n2)/(n1+n2).$$

It should be understood that in the first embodiment, each of the H bridge multi-level leg A 510 and the H bridge multi-level leg B 540 of the H bridge multi-level module 50 is an H bridge multi-level leg with three output levels (0 v, ½Vbus and Vbus), but each of the H bridge multi-level leg A 510 and the H bridge multi-level leg B 540 of the H bridge multi-level module 50 may also be an H bridge multi-level leg with $2^m+1$ output levels to provide much lower change in output voltage, wherein m is an integer equal to or larger than 2.

Figures 13A, 13B:
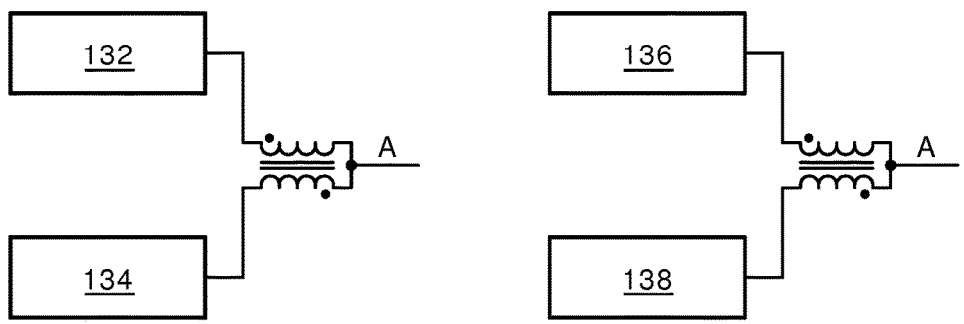
FIG. 13A shows a schematic diagram of an H bridge multi-level leg with five output levels according to a modification of the first embodiment of the invention.
FIG. 13B shows a schematic diagram of an H bridge multi-level leg with nine output levels according to a modification of the first embodiment of the invention.

When each of the H bridge multi-level leg A 510 and the H bridge multi-level leg B 540 of the H bridge multi-level module 50 is an H bridge multi-level leg with $2^m+1$ output levels, the H bridge multi-level leg with $2^m+1$ output levels is configured in the following manner: the H bridge multi-level leg with three output levels is expanded first to an H bridge multi-level leg with five output levels by coupling two H bridge multi-level legs with three output levels in parallel through a coupled inductor being the same as the coupled inductor 516, the H bridge multi-level leg with five output levels is then expanded to an H bridge multi-level leg with nine output levels by coupling two H bridge multi-level legs with five output levels in parallel through a coupled inductor being the same as the coupled inductor 516, . . . , and the H bridge multi-level leg with $2^{m-1}+1$ output levels is expanded finally to an H bridge multi-level leg with $2^m+1$ output levels by coupling two H bridge multi-level legs with $2^{m-1}+1$ output levels in parallel through a coupled inductor being the same as the coupled inductor 516. FIG. 13A and FIG. 13B show schematic diagrams of the H bridge multi-level leg with five output levels and the H bridge multi-level leg with nine output levels respectively, wherein each of 132 and 134 represents the H bridge multi-level leg with three output levels, and each of 136 and 138 represents the H bridge multi-level leg with five output levels.

The Second Embodiment

Figure 14:
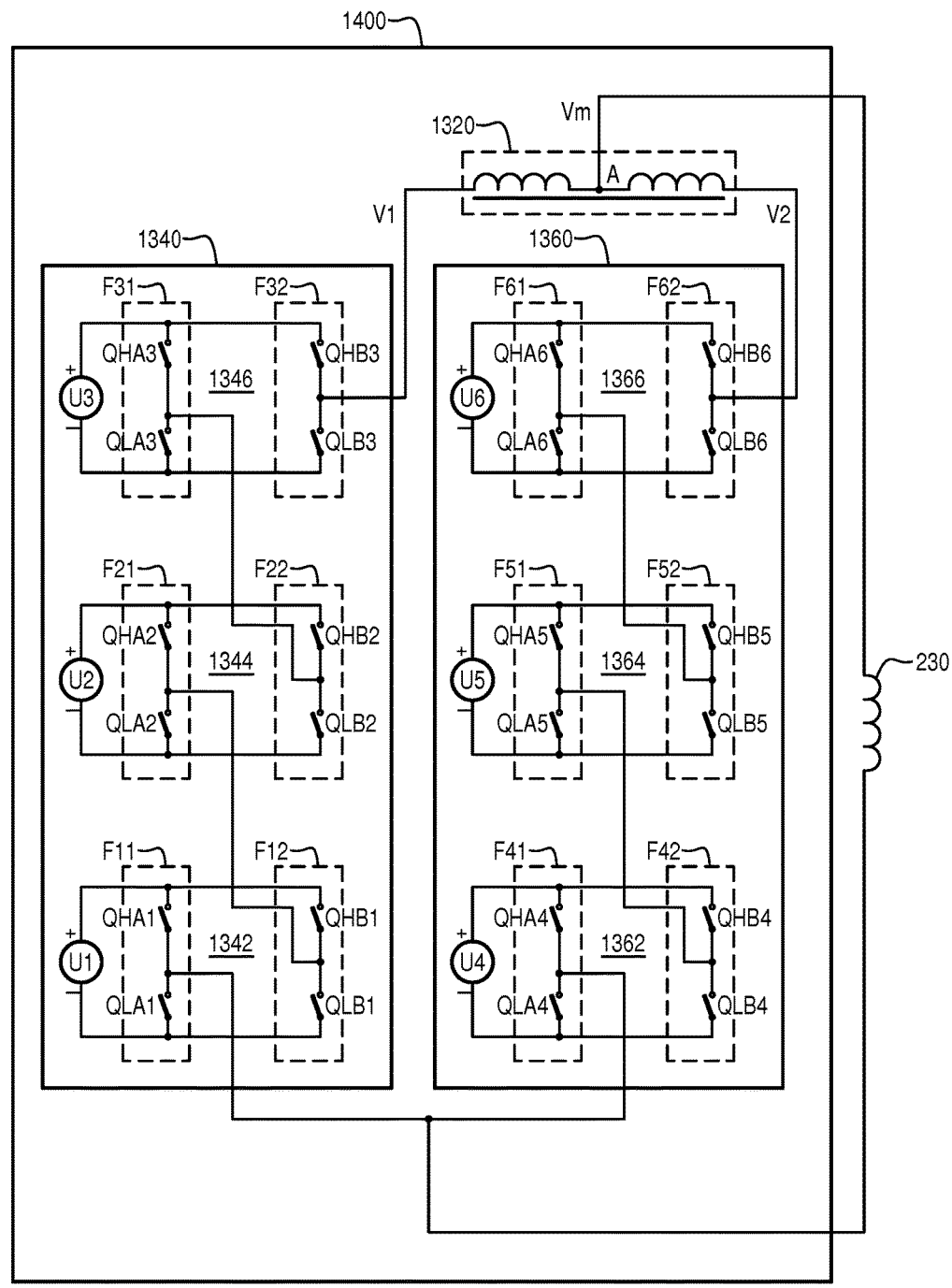
FIG. 14 shows a schematic diagram of a multi-level inverter according to the second embodiment of the invention.

FIG. 14 shows a schematic diagram of a multi-level inverter 1400 according to the second embodiment of the invention. As shown in FIG. 14, the multi-level inverter 1400 may include a coupled inductor 1320, a first H bridge multi-level leg 1340, and a second H bridge multi-level leg 1360. The first H bridge multi-level leg 1340 and the second H bridge multi-level leg 1360 are coupled in parallel through the coupled inductor 1320.

The coupled inductor 1320, which is the same as the coupled inductor 516, may include a primary winding and a secondary winding coupled in series and have a junction node A of the primary winding and the secondary winding. The junction node A of the coupled inductor 1320 forms an output terminal of the multi-level inverter 1400 to provide a multi-level output voltage Vm to the gradient coil 230. One side of the first H bridge multi-level leg 1340 and one side of the second H bridge multi-level leg 1360 are connected to the primary winding and the secondary winding of the coupled inductor 1320 respectively, and a junction node of another side of the first H bridge multi-level leg 1340 and another side of the second H bridge multi-level leg 1360 forms another output terminal of the multi-level inverter 1400.

The first H bridge multi-level leg 1340 may include three cascaded H bridge inverters 1342, 1344, 1346.

The H bridge inverter 1342 may include a first half bridge leg F11 and a second half bridge leg F12 that are connected in parallel to a direct current power supply U1. The first half bridge leg F11 may include a high side switch QHA1 and a low side switch QLA1 coupled in series. The second half bridge leg F12 may include a high side switch QHB1 and a low side switch QLB1 coupled in series. Drive signals for these switches are modulated such that the drive signal for the switch QHA1 and the drive signal for the switch QLA1 are complementary, the drive signal for the switch QHB1 and the drive signal for the switch QLB1 are complementary, the drive signal for the switch QHA1 has the same duty cycle as that of the drive signal for the switch QLB1, and the drive signal for the switch QLB1 has 180° phase shift with respect to the drive signal for the switch QHA1.

Similarly, the H bridge inverter 1344 may include a first half bridge leg F21 consisting of a high side switch QHA2 and a low side switch QLA2 coupled in series and a second half bridge leg F22 consisting of a high side switch QHB2 and a low side switch QLB2 coupled in series, wherein the legs F21 and F22 are connected in parallel to a direct current power supply U2, and drive signals for the switches QHA2, QLA2, QHB2, QLB2 are similar to drive signals for the switches QHA1, QLA1, QHB1, QLB1 except that the drive signal for the switch QHA2 has Θ phase shift with respect to the drive signal for the switch QHA1. The H bridge inverter 1346 may include a first half bridge leg F31 consisting of a high side switch QHA3 and a low side switch QLA3 coupled in series and a second half bridge leg F32 consisting of a high side switch QHB3 and a low side switch QLB3 coupled in series, wherein the legs F31 and F32 are connected in parallel to a direct current power supply U3 and drive signals for the switches QHA3, QLA3, QHB3, QLB3 are similar to drive signals for the switches QHA2, QLA2, QHB2, QLB2 except that the drive signal for the switch QHA2 has the Θ phase shift with respect to the drive signal for the switch QHA2.

The second H bridge multi-level leg 1360 may include three cascaded H bridge inverters 1362, 1364, 1366.

The H bridge inverter 1362 may include a first half bridge leg F41 consisting of a high side switch QHA4 and a low side switch QLA4 coupled in series and a second half bridge leg F42 consisting of a high side switch QHB4 and a low side switch QLB4 coupled in series, wherein the legs F41 and F42 are connected in parallel to a direct current power supply U4, and drive signals for the switches QHA4, QLA4, QHB4, QLB4 are similar to drive signals for the switches QHA1, QLA1, QHB1, QLB1 except that the drive signal for the switch QHA4 has Ψ phase shift with respect to the drive signal for the switch QHA1.

The H bridge inverter 1364 may include a first half bridge leg F51 consisting of a high side switch QHA5 and a low side switch QLA5 coupled in series and a second half bridge leg F52 consisting of a high side switch QHB5 and a low side switch QLB5 coupled in series, wherein the legs F51 and F52 are connected in parallel to a direct current power supply U5, and drive signals for the switches QHA5, QLA5, QHB5, QLB5 are similar to drive signals for the switches QHA2, QLA2, QHB2, QLB2 except that the drive signal for the switch QHA5 has the Ψ phase shift with respect to the drive signal for the switch QHA2.

The H bridge inverter 1366 may include a first half bridge leg F61 consisting of a high side switch QHA6 and a low side switch QLA6 coupled in series and a second half bridge leg F62 consisting of a high side switch QHB6 and a low side switch QLB6 coupled in series, wherein the legs F61 and F62 are connected in parallel to a direct current power supply U6, and drive signals for the switches QHA6, QLA6, QHB6, QLB6 are similar to drive signals for the switches QHA3, QLA3, QHB3, QLB3 except that the drive signal for the switch QHA6 has the Ψ phase shift with respect to the drive signal for the switch QHA3.

The Θ phase shift and the Ψ phase shift among the drive signals results in that there is the Θ phase shift between the output voltages generated by the H bridge inverters 1342, 1344, between the output voltages generated by the H bridge inverters 1344, 1346, between the output voltages generated by the H bridge inverters 1362, 1364, and between the output voltages generated by the H bridge inverters 1364, 1366, and there is the Ψ phase shift between the output voltages generated by the H bridge inverters 1342, 1362, between the output voltages generated by the H bridge inverters 1344, 1364, and between the output voltages generated by the H bridge inverters 1346, 1366. In other words, the modulation of the switches in H-bridge inverters 1342, 1344 and 1346 has a phase shift with respect to the modulation of the switches in H-bridge inverters 1362, 1364 and 1366. This phase shift results in a phase shift between the voltages of the outputs V1 and V2. With the output voltages V1 and V2 according to this modulation scheme provided to the coupled inductor 1320, the ripple frequency of the output signal Vm is multiplied by the number of stacked H-bridge inverters (e.g., 3 stacked H-bridge inverters in the embodiment of FIG. 14), which will be described in more details. Furthermore, it would be understood by the skilled in the art that the number of switching levels of the output signal Vm is increased by a factor equal to the number of stacked H-bridge inverters, since levels of output voltages V1 and V2 is associated with the number of stacked H-bridge inverters.

Further, the direct current power supplies U1, U2, U3, U4, U5, and U6 have the same voltage Vbus.

Compared with the multi-level inverter 70 in the first embodiment that uses six coupled inductor, the multi-level inverter 1400 in the second embodiment uses only one coupled inductor. Thus, the multi-level inverter 1400 of the second embodiment has lower cost and is more compact with respect to the multi-level inverter 70 of the first embodiment.

Figure 15:
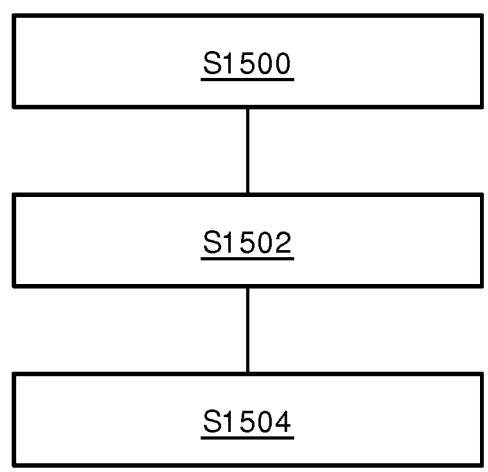
FIG. 15 shows a flow chart of a method for providing a multi-level output voltage by the multi-level inverter according to the second embodiment of the invention.

FIG. 15 shows a flow chart of a method for providing a multi-level output voltage by the multi-level inverter 1400 according to the second embodiment of the invention. The method of FIG. 15 will be explained in detail in conjunction with FIG. 14.

Figure 16A:
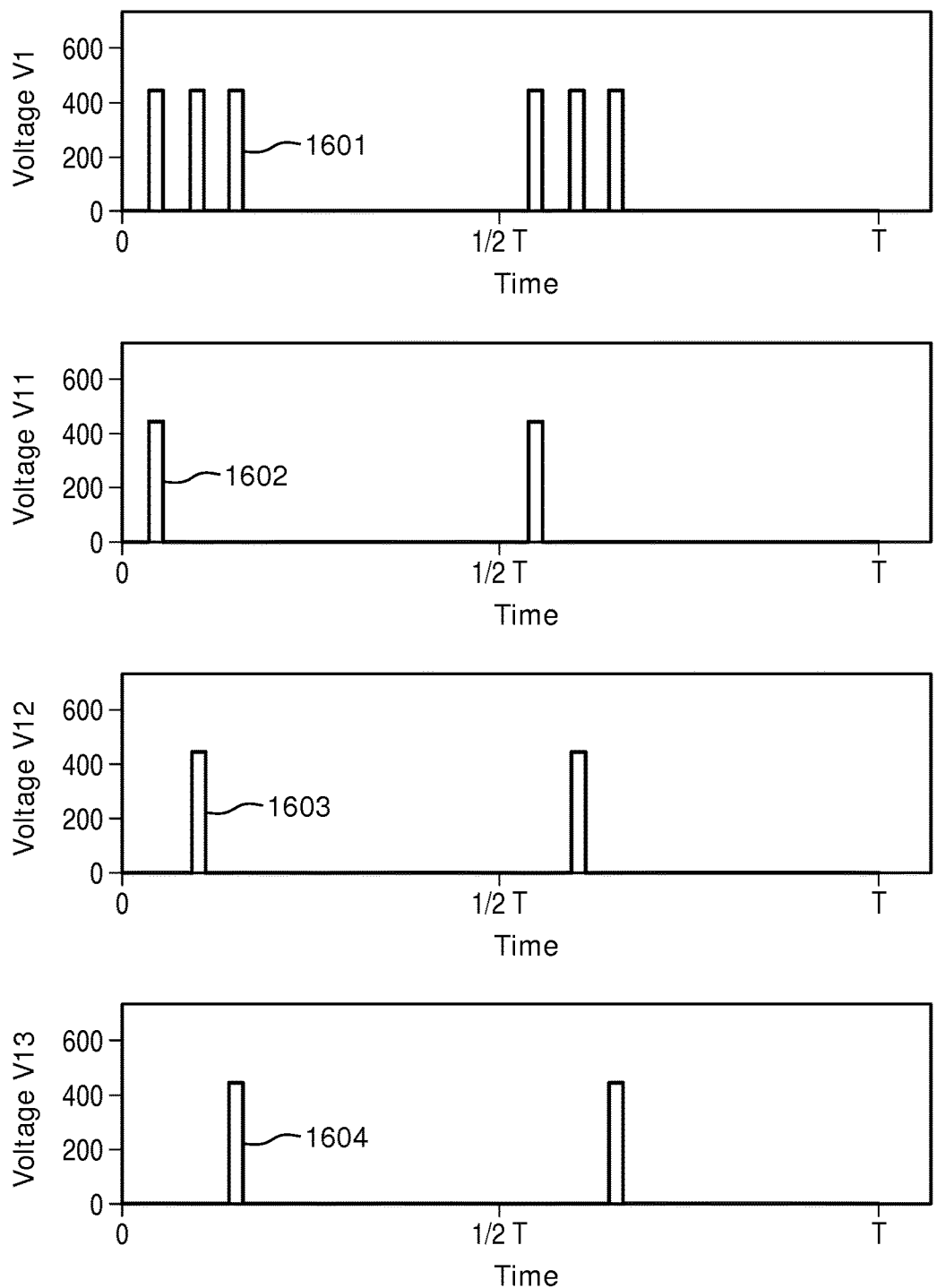
FIG. 16A shows a schematic diagram of voltages generated by a first H bridge multi-level leg of the multi-level inverter and its H bridge inverters according to the second embodiment of the invention.

As shown in FIG. 15, at step S1500, the first H bridge multi-level leg 1340 of the multi-level inverter 1400 generates a voltage V1 with multiple output levels under the condition that the switches included in the first H bridge multi-level leg 1340 are modulated such that the drive signal for the switch QHA1 and the drive signal for the switch QLA1 are complementary, the drive signal for the switch QHB1 and the drive signal for the switch QLB1 are complementary, the drive signal for the switch QHA1 has the same duty cycle as that of the drive signal for the switch QLB1 and the drive signal for the switch QLB1 has 180° phase shift with respect to the drive signal for the switch QHA1, the drive signal for the switch QHA2 and the drive signal for the switch QLA2 are complementary, the drive signal for the switch QHB2 and the drive signal for the switch QLB2 are complementary, the drive signal for the switch QHA2 has the same duty cycle as that of the drive signal for the switch QLB2 and the drive signal for the switch QLB2 has 180° phase shift with respect to the drive signal for the switch QHA2, the drive signal for the switch QHA3 and the drive signal for the switch QLA3 are complementary, the drive signal for the switch QHB3 and the drive signal for the switch QLB3 are complementary, the drive signal for the switch QHA3 has the same duty cycle as that of the drive signal for the switch QLB3 and the drive signal for the switch QLB3 has 180° phase shift with respect to the drive signal for the switch QHA3, and there is the $\Theta$ phase shift between the drive signals for the switches QHA1, QHA2 and between the drive signals for the switches QHA2, QHA3. The voltage V1 is inputted into the primary winding of the coupled inductor 1320. An example of the voltages generated by the first H bridge multi-level leg 1340 and its H bridge inverters is shown in FIG. 16A, wherein T represents one period, the voltages V1, V11, V12, V13 that are represented by 1601, 1602, 1603 and 1604 respectively are outputted by the first H bridge multi-level leg 1340 and the H bridge inverters 1342, 1344, 1346 respectively, and it is assumed the Vbus is 450 v.

At step S1502, the second H bridge multi-level leg 1360 of the multi-level inverter 1400 generates a voltage V2 with multiple output levels under the condition that the switches included in the second H bridge multi-level leg 1360 are modulated such that there is the $\Psi$ phase shift between the drive signals for the switches QHA1, QHA4, between the drive signals for the switches QHA2, QHA5 and between the drive signals for the switches QHA3, QHA6, the drive signal for the switch QHA4 and the drive signal for the switch QLA4 are complementary, the drive signal for the switch QHB4 and the drive signal for the switch QLB4 are complementary, the drive signal for the switch QHA4 has the same duty cycle as that of the drive signal for the switch QLB4 and the drive signal for the switch QLB4 has 180° phase shift with respect to the drive signal for the switch QHA4, the drive signal for the switch QHA5 and the drive signal for the switch QLA5 are complementary, the drive signal for the switch QHB5 and the drive signal for the switch QLB5 are complementary, the drive signal for the switch QHA5 has the same duty cycle as that of the drive signal for the switch QLB5 and the drive signal for the switch QLB5 has 180° phase shift with respect to the drive signal for the switch QHA5, the drive signal for the switch QHA6 and the drive signal for the switch QLA6 are complementary, the drive signal for the switch QHB6 and the drive signal for the switch QLB6 are complementary, the drive signal for the switch QHA6 has the same duty cycle as that of the drive signal for the switch QLB6 and the drive signal for the switch QLB6 has 180° phase shift with respect to the drive signal for the switch QHA6, and there is the $\Psi$ phase shift between the drive signals for the switches QHA1, QHA4, between the drive signals for the switches QHA2, QHA5 and between the drive signals for the switches QHA3, QHA6. The voltage V2 is inputted into the secondary winding of the coupled inductor 1320. Since there is the $\Psi$ phase shift between the drive signals for the switches QHA1, QHA4, between the drive signals for the switches QHA2, QHA5 and between the drive signals for the switches QHA3, QHA6, the voltage V2 has the $\Psi$ phase shift relative to the voltage V1.

Figure 16B:
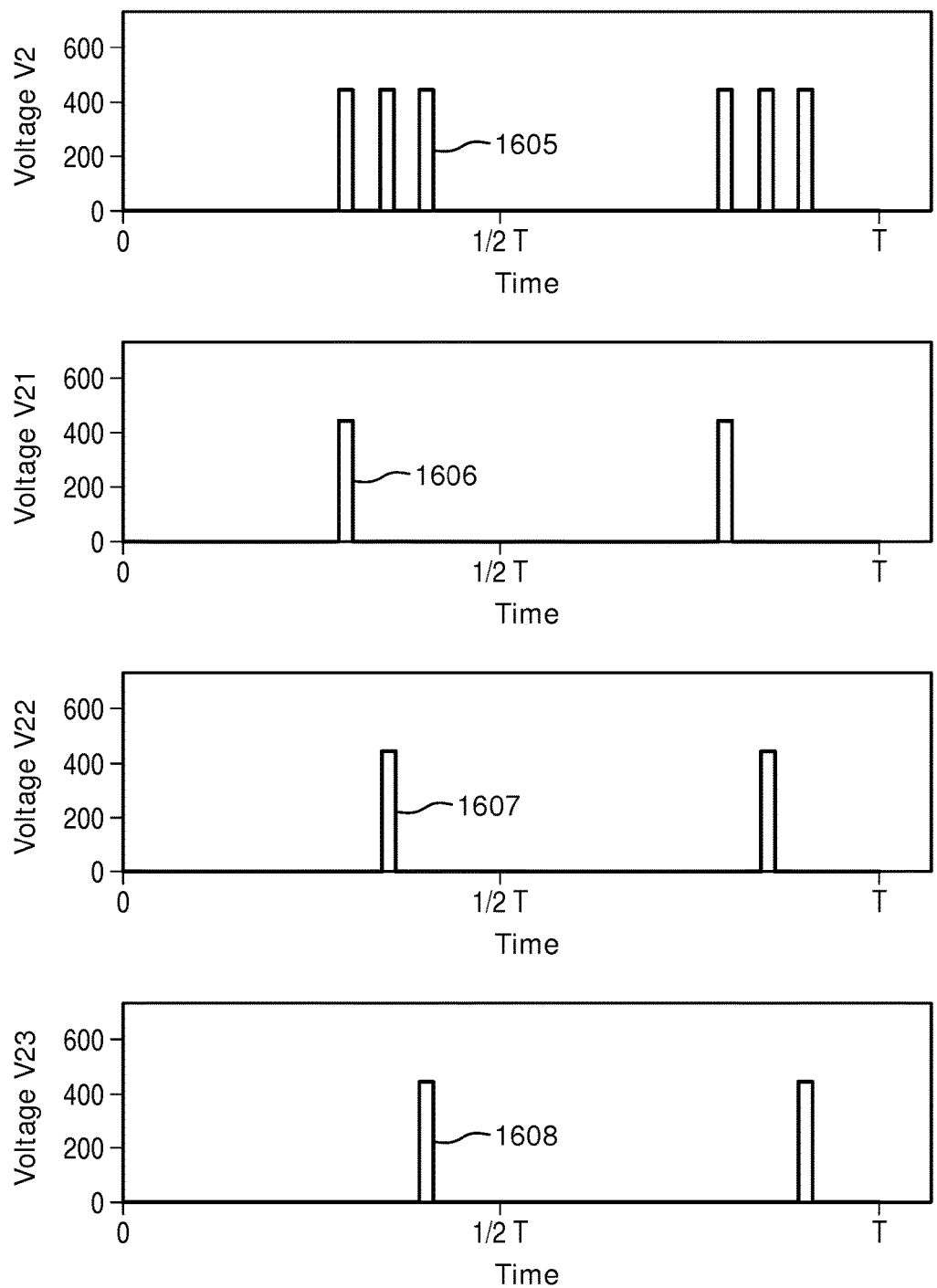
FIG. 16B shows a schematic diagram of voltages generated by a second H bridge multi-level leg of the multi-level inverter and its H bridge inverters according to the second embodiment of the invention.

An example of the voltages generated by the second H bridge multi-level leg 1360 and its H bridge inverters is shown in FIG. 16B, wherein T represents one period, the voltages V2, V21, V22, V23 that are represented by 1605, 1606, 1607 and 1608 respectively are outputted by the second H bridge multi-level leg 1360 and the H bridge inverters 1362, 1364, 1366 respectively, and it is assumed the Vbus is 450 v.

At step S1504, the multi-level inverter 1400 generates an output voltage Vm from the voltage V1 and the voltage V2. In the second embodiment, turn ratio of the primary and secondary windings of the coupled inductor 1320 is 1:1, and thus the voltage Vm is calculated according to Equation 3.

$$Vm=(V1+V2)/2 \qquad \text{(Equation 3)}$$

Figure 16C:
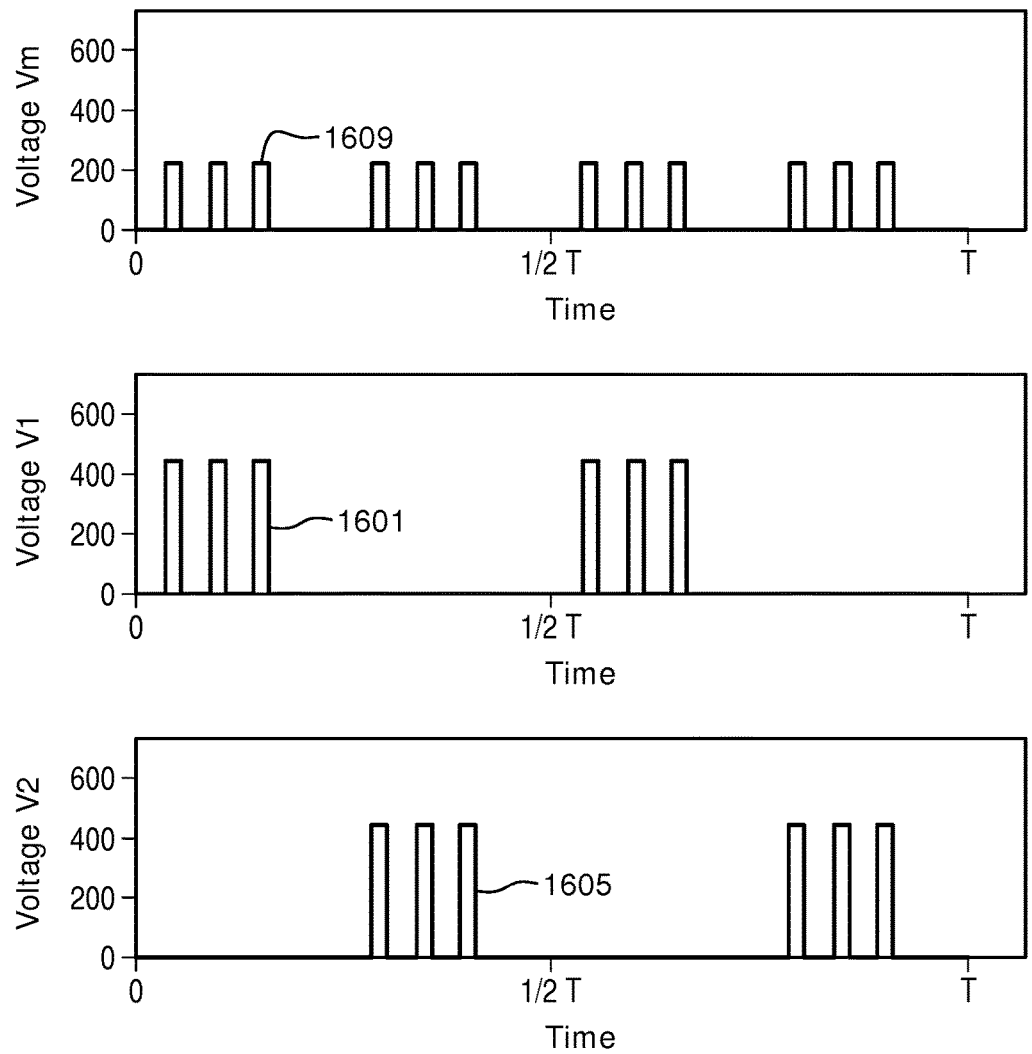
FIG. 16C shows a schematic diagram of an output voltage generated by the multi-level inverter according to the second embodiment of the invention.

An example of the output voltage Vm generated by the multi-level inverter 1400 is shown in FIG. 16C, wherein the voltage Vm is represented by 1609.

As can be seen from FIG. 16C, the output voltage Vm generated by the multi-level inverter 1400 toggles between 0 v and ½Vbus (225 v) in every transition, and thus the output voltage Vm generated by the multi-level inverter 1400 alters ½Vbus in every transition. Therefore, the multi-level inverter 1400 has lower change in output voltage compared with the existing gradient amplifier.

Further, as can be seen from the contents disclosed in the second embodiment, the output voltages V11, V12, V13 generated by the three cascaded H bridge inverters 1342, 1344, 1346 of the first H bridge multi-level leg 1340 of the multi-level inverter 1400 and the output voltages V21, V22, V23 generated by the three cascaded H bridge inverters 1362, 1364, 1366 of the second H bridge multi-level leg 1360 of the multi-level inverter 1400 are connected by means of the coupled inductor 1320 and are modulated with the $\Theta$ phase shift and the $\Psi$ phase shift. Thus, the combination of the modulation scheme and the coupled inductor 1320 results in that the output voltage Vm generated by the multi-level inverter 1400 includes twelve voltage pulses within every period, as shown in FIG. 16C, whereas each of the H bridge inverters 1342, 1344, 1346, 1362, 1364, 1366 includes only two voltage pulses within every period, as shown in FIG. 16A and FIG. 16B, and thus the ripple frequency of the output voltage Vm of the multi-level inverter 1400 is six times of the ripple frequency of the output voltage generated by each H bridge inverter and the switching frequency of the multi-level inverter 1400 is six times of the switching frequency of each H bridge inverter. Since the multi-level inverter 1400 includes six cascaded H bridge inverters, the combination of the modulation scheme and the coupled inductor 1320 results in that ripple frequency of the output voltage of the multi-level inverter 1400 is multiplied by the number of cascaded H bridge inverters included in the multi-level inverter 1400.

The Third Embodiment

Figure 17:
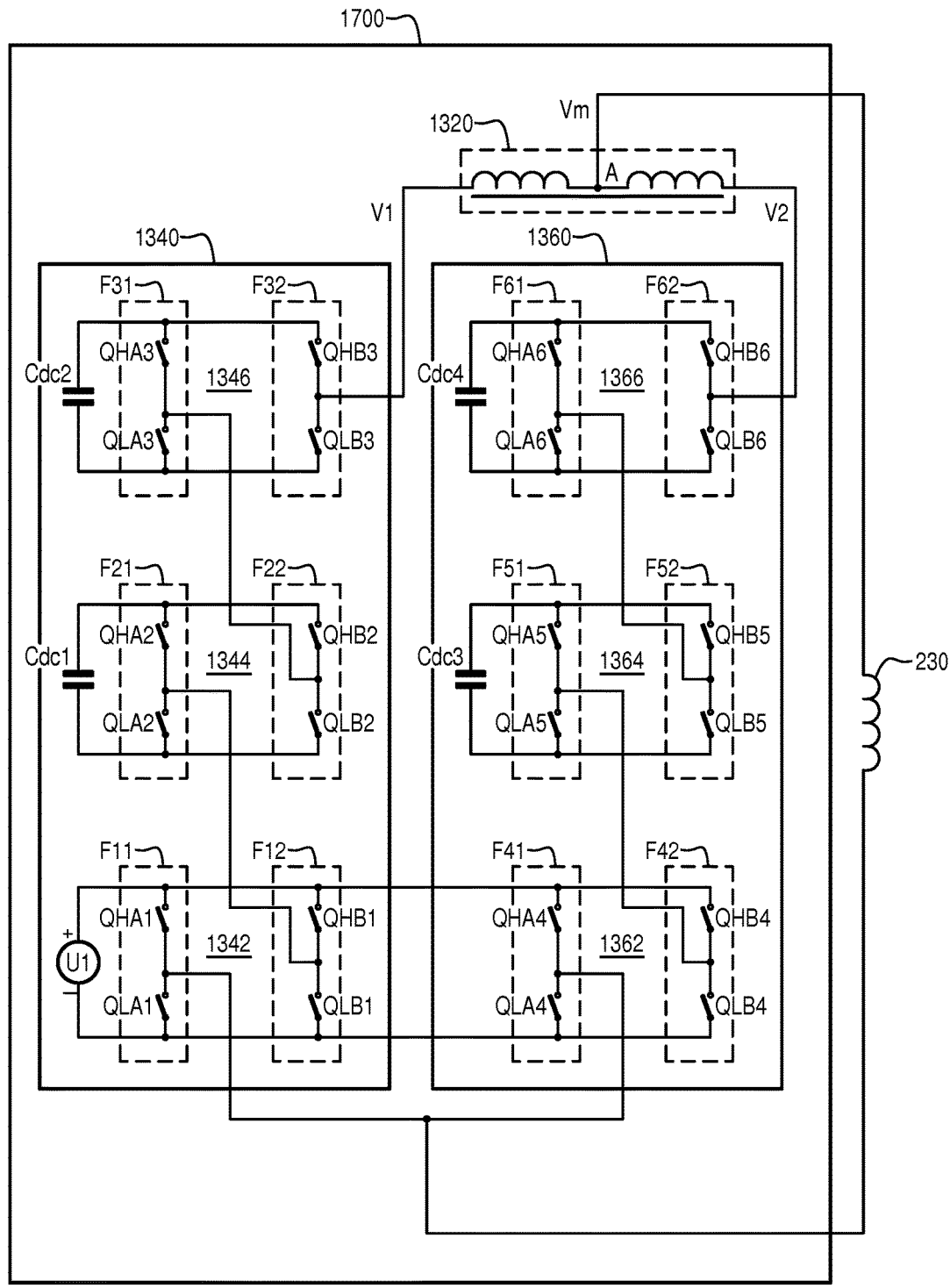
FIG. 17 shows a schematic diagram of a multi-level inverter according to a third embodiment of the invention.

FIG. 17 shows a schematic diagram of a multi-level inverter 1700 according to the third embodiment of the invention. As shown in FIG. 17, the multi-level inverter 1700 of the third embodiment is different from the multi-level inverter 1400 of the second embodiment in that both of the H bridge inverters 1342 and 1362 are connected to the single direct current power supply U1 (that is, the H bridge inverters 1342 and 1362 are powered H bridge inverters), and the H bridge inverters 1344, 1346 of the first H bridge multi-level leg 1340 and the H bridge inverters 1364 and 1366 of the second H bridge multi-level leg 1360 are floating H bridge inverters. That is, the H bridge inverter 1344 as the floating H bridge inverter is connected to a capacitor Cdc1 instead of the direct current power supply U2, the H bridge inverter 1346 as the floating H bridge inverter is connected to a capacitor Cdc2 instead of the direct current power supply U3, the H bridge inverter 1364 as the floating H bridge inverter is connected to a capacitor Cdc3 instead of the direct current power supply U5, and the H bridge inverter 1366 as the floating H bridge inverter is connected to a capacitor Cdc4 instead of the direct current power supply U6. The floating H bridge inverter is described in details in PCT application WO 2010/109399A1, the entire disclosure of which is incorporated herein by reference.

Compared with the multi-level inverter 1400 in the second embodiment, the multi-level inverter 1700 in the third embodiment may need less direct current power supplies. Further, introduction of the floating H bridge inverters in the multi-level inverter 1700 gives an additional degree of freedom to the modulation algorithm of the multi-level inverter 1700, which can be used to charge the capacitors of the floating H bridge inverters of the multi-level inverter 1700 at start-up even if zero current flows through the gradient coil 230.

Description of a method for providing a multi-level output voltage by the multi-level inverter 1700 according to the third embodiment of the invention is omitted herein because it is the same as the method according to the second embodiment of the invention described above.

The Fourth Embodiment

Figure 18:
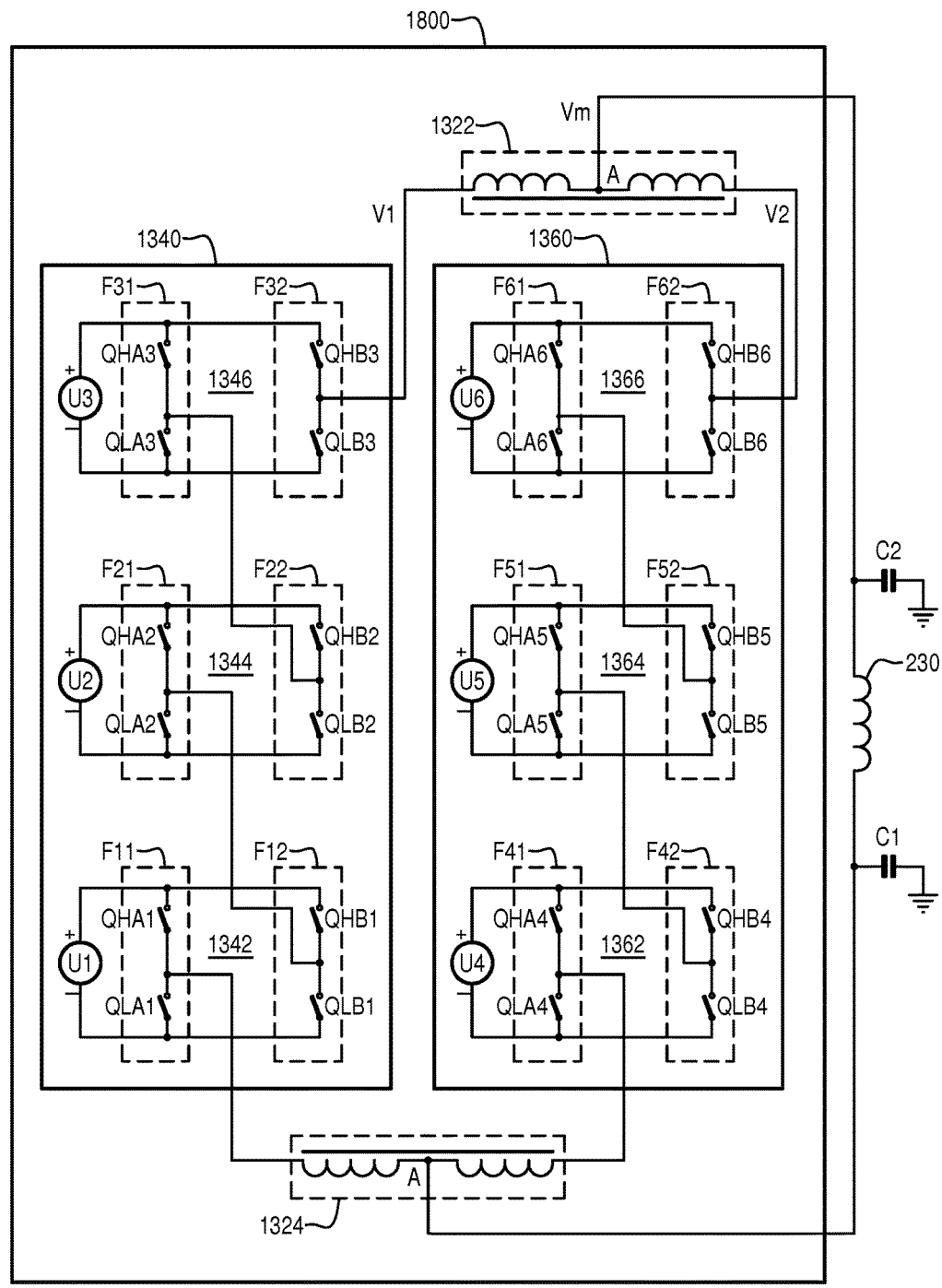
FIG. 18 shows a schematic diagram of a multi-level inverter according to a fourth embodiment of the invention.

FIG. 18 shows a schematic diagram of a multi-level inverter 1800 according to the fourth embodiment of the invention. As shown in FIG. 18, the multi-level inverter 1800 in the fourth embodiment is different from the multi-level inverter 1400 in the second embodiment in that the multi-level inverter 1800 includes a set of coupled inductors 1322, 1324 instead of the coupled inductor 1320. Each of the coupled inductors 1322, 1324 has half impedance of the coupled inductor 1320 of the second embodiment, that is, the coupled inductor 1320 of the second embodiment is split into the set of coupled inductors 1322, 1324.

Each of the set of coupled inductors 1322, 1324, which is the same as the coupled inductor 1320, may include a primary winding and a secondary winding coupled in series and have a junction node A of the primary winding and the secondary winding.

As shown in FIG. 18, the split set of coupled inductors 1322, 1324 are symmetrically coupled to both sides of the first and second H bridge multi-level legs 1340, 1360. Specifically, the first H bridge multi-level leg 1340 is coupled between the primary windings of the coupled inductors 1322, 1324, and the second H bridge multi-level leg 1360 is coupled between the second windings of the coupled inductors 1322, 1324. The junction nodes A of the coupled inductors 1322, 1324 form two output terminals of the multi-level inverter 1800.

Since the coupled inductors 1322, 1324 are arranged symmetrically in the multi-level inverter 1800, the multi-level inverter 1800 is beneficial for galvanic isolation requirement and EMC compliance. Further, if two capacitors C1 and C2 are arranged at two sides of the gradient coil 230 respectively, a second order filter can be formed by combining the set of coupled inductors 1322, 1324 with the two capacitors C1 and C2, which can attenuate the high frequency harmonics more effectively.

Description of a method for providing a multi-level output voltage by the multi-level inverter 1800 according to the fourth embodiment of the invention is omitted herein because it is the same as the method according to the second embodiment of the invention as described above.

The Fifth Embodiment

Figure 19:
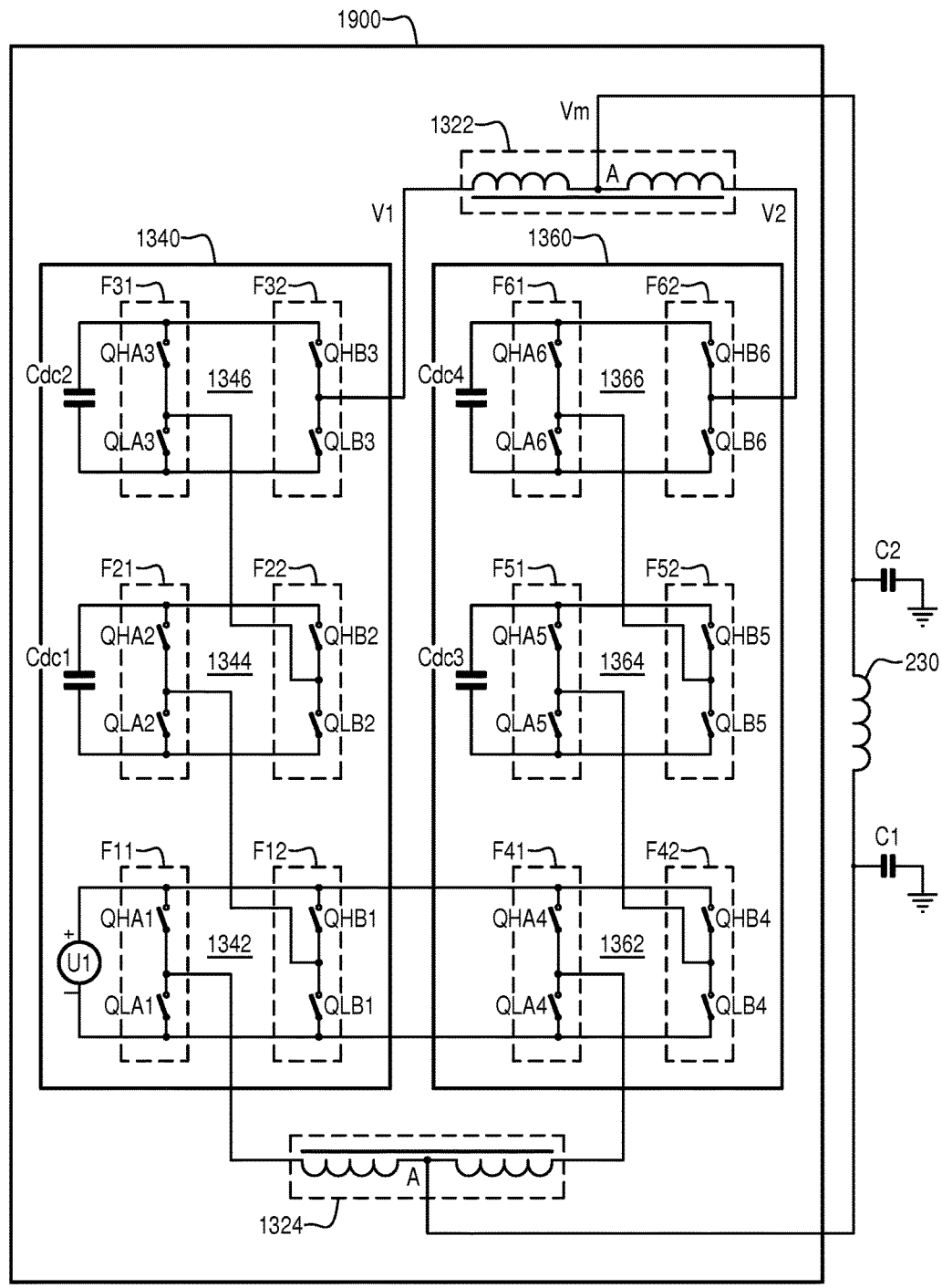
FIG. 19 shows a schematic diagram of a multi-level inverter according to a fifth embodiment of the invention.

FIG. 19 shows a schematic diagram of a multi-level inverter 1900 according to the fifth embodiment of the invention. As shown in FIG. 19, the multi-level inverter 1900 in the fifth embodiment is different from the multi-level inverter 1800 in the fourth embodiment in that the H bridge inverters 1342 and 1362 are powered H bridge inverters, and the H bridge inverters 1344, 1346 of the first H bridge multi-level leg 1340 and the H bridge inverters 1364 and 1366 of the second H bridge multi-level leg 1360 are floating H bridge inverters.

Description of a method for providing a multi-level output voltage by the multi-level inverter 1900 according to the fifth embodiment of the invention is omitted herein because it is the same as the method according to the second embodiment of the invention as described above.

Modifications

It should be understood that in the second and fourth embodiments, the direct current power supplies U1, U2, U3, U4, U5, and U6 have the same voltage Vbus, but it is readily occur to the skilled in the art that the direct current power supplies U1, U2, U3, U4, U5, and U6 may also have different voltages from each other.

It should be understood that the Θ phase shift and/or the Ψ phase shift described in the second, third, fourth and fifth embodiments may be constant or variable with time.

It should be understood that in the second, third, fourth and fifth embodiments, there is the same Θ phase shift between the drive signals of the switches QHA1, QHA2, between the drive signals of the switches QHA2, QHA3, between the drive signals of the switches QHA4, QHA5 and between the drive signals of the switches QHA5, QHA6, but these phase shifts may also be different from each other.

It should be understood that in the second, third, fourth and fifth embodiments, there is the same Ψ phase shift between the drive signals of the switches QHA1, QHA4, between the drive signals of the switches QHA2, QHA5 and between the drive signals of the switches QHA3, QHA6, but these phase shifts may also be different from each other.

It should be understood that in the second, third, fourth and fifth embodiments, each of the first H bridge multi-level leg 1340 and the second H bridge multi-level leg 1360 includes three cascaded H bridge inverters, but the number of H bridge inverters included in each of the first H bridge multi-level leg 1340 and the second H bridge multi-level leg 1360 may also be less than or larger than three as needed.

It should be understood that in the second, third, fourth and fifth embodiments, the number of H bridge inverters included in the first H bridge multi-level leg 1340 is the same as the number of H bridge inverters included in the second H bridge multi-level leg 1360, but the number of H bridge inverters included in the first H bridge multi-level leg 1340 may also be different from the number of H bridge inverters included in the second H bridge multi-level leg 1360.

It should be understood that each of the first H bridge multi-level leg 1340 and the second H bridge multi-level leg 1360 in the third and fifth embodiments includes one power H bridge inverter and two floating H bridge inverters, but each of the first H bridge multi-level leg 1340 and the second H bridge multi-level leg 1360 may also include at least one power H bridge inverter and at least one floating H bridge inverter.

It should be understood that in the second, third, fourth and fifth embodiments, the turn ratio of the primary and secondary windings of the coupled inductor 1320 is 1:1, but the turn ratio of the primary and secondary windings of the coupled inductor 1320 may also be n3:n4, wherein n3 and n4 are integers different from each other. In this case, the voltage Vm is calculated according to the following equation: $Vm=(V1*n3+V2*n4)/(n3+n4)$.

Figure 20:
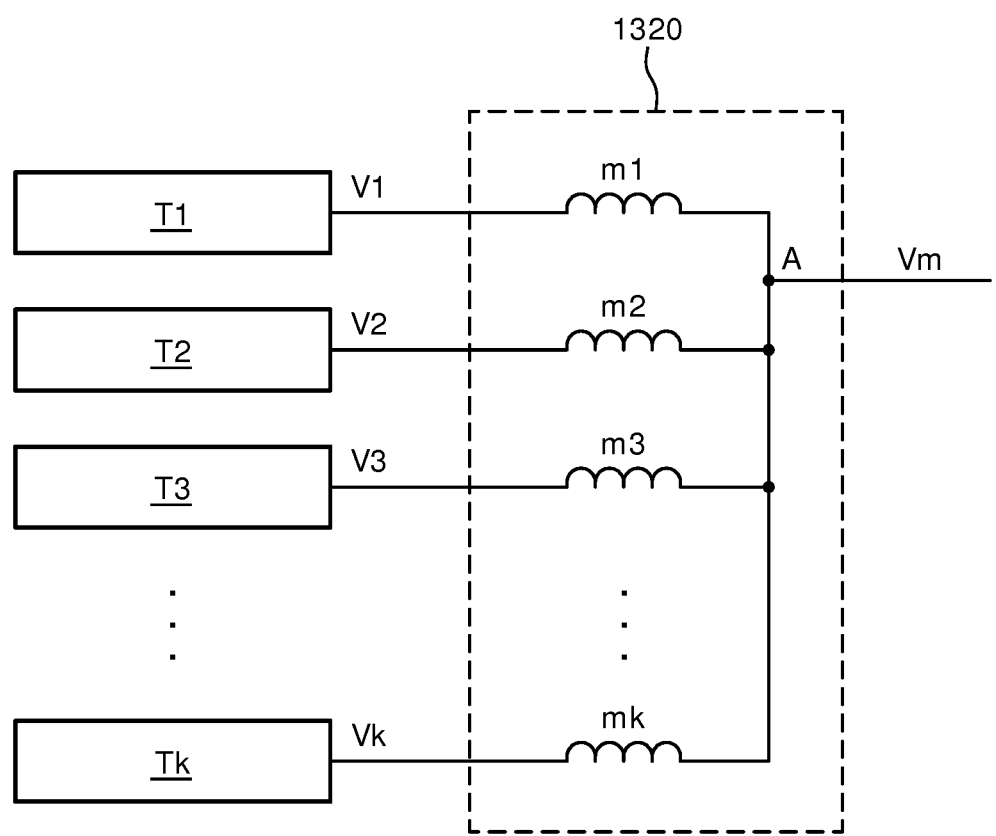
FIG. 20 shows a schematic diagram of connection relationship between k windings of the coupled inductor and k H bridge multi-level legs of the multi-level inverter according to a modification of the second and third embodiments of the invention.

It should be understood that in the second and third embodiments, the multi-level inverter includes two H bridge multi-level legs 1340, 1360, but the multi-level inverter may also include k H bridge multi-level legs T1, T2, T3, . . . , Tk, wherein k is an integer larger than two. The switches included in the multi-level inverter are modulated such that voltages generated by the k H bridge multi-level legs have a phase shift relative to each other and voltages generated by H bridge inverters included in each of the k H bridge multi-level legs have a phase shift relative to each other. In this case, the coupled inductor 1320 includes K windings m1, m2, m3, . . . , mk connected together and has a junction node A of the K windings. Each of the k H bridge multi-level legs T1, T2, T3, . . . , Tk included in the multi-level inverter is connected to one of the k windings m1, m2, m3, . . . , mk of the coupled inductor 1320. FIG. 20 shows a schematic diagram of connection relationship between the k windings of the coupled inductor 1320 and the k H bridge multi-level legs of the multi-level inverter, wherein the H bridge multi-level leg T1 is coupled to the winding m1 of the coupled inductor 1320 for providing an input voltage V1, the H bridge multi-level leg T2 is coupled to the winding m2 of the coupled inductor 1320 for providing an input voltage V2, the H bridge multi-level leg T3 is coupled to the winding m3 of the coupled inductor 1320 for providing an input voltage V3, . . . , the H bridge multi-level leg Tk is coupled to the winding mk of the coupled inductor 1320 for providing an input voltage Vk, and the junction node A of the coupled inductor 1320 outputs a voltage Vm as the output voltage of the multi-level inverter. It is apparent that the more the H bridge multi-level legs included in the multi-level inverter are, the more the voltage pulses included in the output voltage of the multi-level inverter within each period are, which results in less current ripple of the gradient coil 230.

It should be understood that in the fourth and fifth embodiments, the multi-level inverter includes two H bridge multi-level legs 1340, 1360, but the multi-level inverter may also include k H bridge multi-level legs. In this case, each of the coupled inductors 1322 and 1324 includes k windings connected together and has a junction node A of the k windings. Each of the k H bridge multi-level legs included in the multi-level inverter is connected between one of the k windings of the coupled inductor 1322 and one of the k windings of the coupled inductor 1324. The switches included in the multi-level inverter are modulated such that voltages generated by the k H bridge multi-level legs have a phase shift relative to each other and voltages generated by H bridge inverters included in each of the k H bridge multi-level legs have a phase shift relative to each other.

Although preferred embodiments have been described in detail as examples, other embodiments and modifications of this invention will be apparent to those having ordinary skill in the art upon consideration of the specification and practice of the invention disclosed herein. The specification and examples given should be considered exemplary only, and it is contemplated that the appended claims will cover any other such embodiments or modifications as fall within the true scope of the invention.

Please note that, the steps of the methods shown in the present invention should not be limited to the steps mentioned above. It will be apparent to those skilled in the art that the various aspects of the invention claimed may be practiced in other examples that depart from these specific details.

Furthermore, as can be easily understood by the skilled in the art, in the apparatus claim enumerating several means, several of these means can be embodied by one and the same item of hardware. The mere fact that certain measures are recited in mutually different dependent claims does not indicate that a combination of these measures cannot be used to advantage.

It should be noted that the above-mentioned embodiments illustrate rather than limit the invention and that those skilled in the art would be able to design alternative embodiments without departing from the scope of the appended claims. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the system claims enumerating several units, several of these units can be embodied by one and the same item of software and/or hardware. The usage of the words first, second and third, et cetera, does not indicate any ordering. These words are to be interpreted as names.

The invention claimed is:

1. A multi-level inverter comprising:
   n H-bridge multi-level legs, each of which has a plurality M of cascaded H-bridge inverters connected in series, wherein n is an integer larger than 1 and M is an integer larger than 1; and
   a first coupled inductor having n windings wound around a core and coupled together at a junction node of the n windings, wherein the n H-bridge multi-level legs are coupled in parallel through the coupled inductor, and wherein each of the n H-bridge multi-level legs is coupled at a first end to one of the n windings for providing an input voltage with multiple voltage levels, and the junction node forms an output terminal of the multi-level inverter for providing multi-level output levels, and wherein the input voltages provided by the n H-bridge multi-level legs have a phase shift (θ) relative to each other and the M H-bridge inverters of each of the H-bridge multi-level legs have a phase shift of 360°/M relative to each other.

2. The multi-level inverter of claim 1, further including:
a second coupled inductor having n windings, each of the n H-bridge multi-level legs being coupled at a second end to one of the n windings of the second coupled inductor.

3. The multi-level inverter of claim 1, wherein M is greater than 2.

4. The multi-level inverter of claim 1, wherein the M cascaded H-bridge inverters of each H-bridge multi-level leg comprise at least one powered H-bridge inverter and at least one floating H-bridge inverter.

5. A multi-level inverter comprising:
n H-bridge multi-level legs, each leg including a plurality of cascaded H-bridge inverters, wherein n is an integer larger than 1; and
first and second coupled inductors symmetrically coupled to first and second sides of each of the n H-bridge multi-level legs to connect the legs in parallel, each of the coupled inductors having n windings wound around a core and coupled together at a junction node of the n windings, wherein each of the n H-bridge multi-level legs is coupled in parallel between one of the n windings of the first coupled inductor and one of the n windings of the second coupled inductor for providing an input voltage with multiple voltage levels, and the junction nodes in the first and second coupled inductors form output terminals of the multi-level inverter for providing multi-level output levels, and wherein input voltages provided by the n H-bridge multi-level legs have a first phase shift relative to each other and the H-bridge inverters of each H-bridge multi-level leg have a different phase shift relative to each other.

6. The multi-level inverter of claim 5, wherein there are more than two H-bridge inverters in each H-bridge multi-level leg.

7. The multi-level inverter of claim 5, wherein the plurality of H-bridge inverters include at least one powered H-bridge inverter and at least one floating H-bridge inverter.

8. A multi-level inverter, comprising:
at least one cascaded H-bridge multi-level module, wherein each H-bridge multi-level module comprises:
a DC voltage source supplying DC voltage to a high line and a low line,
a first H-bridge multi-level leg having a plurality of output levels at an output terminal of the first H-bridge multi-level leg,
a second H-bridge multi-level leg having a plurality of output levels at an output terminal of the second H-bridge multi-level leg,
wherein the first and second H-bridge multi-level legs are connected across the high and low lines in parallel and
wherein multi-level outputs of the H-bridge multi-level module are outputted between the output terminals of the first and second H-bridge multi-level legs,
wherein each of the first and second H-bridge multi-level legs comprises a first inverter leg and a second inverter leg connected across the high and low lines in parallel through a coupled inductor including a primary winding and a secondary winding wound around a core, the first inverter leg being coupled to the primary winding of the coupled inductor for providing a first input voltage with multiple voltage levels, the second inverter leg being coupled to the secondary winding of the coupled inductor for providing a second input voltage with multiple voltage levels, the primary and secondary windings of the coupled inductor being coupled in series and a junction node of the primary and secondary windings coupled in series forms an output terminal of the H-bridge multi-level leg, wherein the first input voltage has a predetermined phase shift (θ) relative to the second input voltage such that three levels of voltage are generated across the output terminals of the first and second H-bridge multi-level legs in each period.

9. The multi-level inverter of claim 8, wherein each of the first and second inverter legs comprises a half-bridge leg with a high side switch (QAH) and a low side switch (QAL) coupled in series.

10. The multi-level inverter of claim 9, wherein drive signals for the high side switches (QAH) in the first and second inverter legs of the first H-bridge multi-level leg have the predetermined phase shift (θ) relative to each other and drive signals for the low side switches (QAL) in the first and second inverter legs of the second H-bridge multi-level leg have the predetermined phase shift (θ) relative to each other.

11. The multi-level inverter of claim 8, wherein the first and second input voltages have $2^{n-1}+1$ voltage levels resulting in $2^n+1$ output levels outputted from each of the first and second H-bridge multi-level legs, where n is an integer equal or greater than 1.

12. The multi-level inverter of claim 11, wherein H-bridge multi-level leg with $2^k+1$ output levels is expanded to H-bridge multi-level leg with $2^{k+1}+1$ output levels by coupling two H-bridge multi-level legs with $2^k+1$ output levels in parallel through the coupled inductor, wherein k is 1, ..., n.

13. The multi-level inverter of claim 8, wherein M H-bridge multi-level modules are cascaded and the output of each H-bridge multi-level module has a 360°/M phase shift relative to adjacent H-bridge multi-level module, wherein M is an integer equal or greater than 2.

14. A method for providing multi-level output voltage by a multi-level inverter, wherein the multi-level inverter comprises at least one cascaded H-bridge multi-level module, wherein each H-bridge multi-level module comprises a DC voltage source supplying DC voltage across a high line and a low line, a first H-bridge multi-level leg and a second H-bridge multi-level leg connected across the high and Towlines in parallel and an output voltage of the H-bridge multi-level module are outputted between output terminals of the first and second H-bridge multi-level legs, wherein each of the first and second H-bridge multi-level legs comprises a first inverter leg and a second inverter leg connected across the high and low lines in parallel through a coupled inductor including a primary winding and a secondary winding wound around a core, the first inverter leg is coupled to the primary winding of the coupled inductor, the second inverter leg being coupled to a secondary winding of the coupled inductor, the primary and secondary windings of the coupled inductor are coupled in series and a junction node of the primary and secondary windings coupled in series forms an output terminal of the H-bridge multi-level module, the method comprising:

generating, by the first inverter leg of the first H-bridge multi-level leg of each H-bridge multi-level module, a first voltage with multiple levels;

generating, by the second inverter leg of the first H-bridge multi-level leg of each H-bridge multi-level module, a second voltage with multiple levels that has a predetermined phase shift relative to the first voltage;

generating, by the first H-bridge multi-level leg of each H-bridge multi-level module, a third voltage with at least 3 levels based on combining the generated first voltage and the second voltage with the predetermined relative phase shift;

generating, by the first inverter leg of the second H-bridge multi-level leg of each H-bridge multi-level module, a fourth voltage with multiple levels;

generating, by the second inverter leg of the second H-bridge multi-level leg of each H-bridge multi-level module, a fifth voltage with multiple levels that has the predetermined phase shift relative to the fourth voltage;

generating, by the second H-bridge multi-level leg of each H-bridge multi-level module, a sixth voltage with at least 3 levels based on combining the generated fourth voltage with the fifth voltage with predetermined relative phase shift;

generating, by each H-bridge multi-level module, a multi-level output voltage based on the generated third and sixth voltages; and providing a multi-level output voltage of the multi-level inverter based on the multi-level output voltage outputted by each H-bridge multi-level module.

15. The method of claim 14, wherein each of the first and second inverter legs comprises a half-bridge leg with a high side switch and a low side switch coupled in series, wherein drive signals for the high side switches in the first and second inverter legs of the first H-bridge multi-level leg have the predetermined phase shift relative to each other and drive signals for the low side switches in the first and second inverter legs of the second H-bridge multi-level leg have the predetermined phase shift relative to each other, wherein the phase shift is greater than 0° and less than 180°.

16. A method for providing a multi-level output voltage by a multi-level inverter, wherein the multi-level inverter comprising n H-bridge multi-level legs and a coupled inductor including n windings wound around a core, wherein n is an integer larger than 2, and wherein each of the n H-bridge multi-level legs has at least one cascaded H-bridge inverter and the n windings are coupled together at a junction node (A), and wherein the n H-bridge multi-level legs are coupled in parallel through the coupled inductor, and wherein each of the n H-bridge multi-level legs is coupled to one of the n windings, and the junction node (A) forms an output terminal of the multi-level inverter, the method comprising:

generating, by the n H-bridge multi-level legs (T1, T2, T3 . . . Tn), n voltages each of which has multiple voltage levels, wherein the n voltages have a phase shift relative to each other; and providing a multi-level output voltage outputted by the multi-level inverter based on the generated n voltages.

17. A method for providing a multi-level output voltage by a multi-level inverter, wherein the multi-level inverter comprising n H-bridge multi-level legs and a split set of coupled inductors, wherein n is an integer larger than 1, and wherein each of the n H-bridge multi-level legs has at least one cascaded H-bridge inverter, and first and second coupled inductors are symmetrically coupled to both sides of the n H-bridge multi-level legs, and wherein each of the coupled inductor set has n windings wound around a core and coupled together at a junction node (A) of the n windings, wherein each of the n H-bridge multi-level legs is coupled between one of the n windings of the first coupled inductor and one of the n windings of the second coupled inductor, and the junction nodes in the first and second coupled inductors form output terminals of the multi-level inverter, the method comprising:

generating, by the n H-bridge multi-level legs, n voltages each of which has multiple voltage levels, wherein the n voltages have a phase shift relative to each other wherein the phase shift is greater than 0° and less than 180°; and providing a multi-level output voltage outputted across the output terminals of the first and second coupled inductors of the multi-level inverter based on the generated n voltages.

* * * * *